US008815672B2

(12) United States Patent
Lee et al.

(10) Patent No.: US 8,815,672 B2
(45) Date of Patent: Aug. 26, 2014

(54) METHODS OF MANUFACTURING SEMICONDUCTOR DEVICES

(75) Inventors: Seung-Hun Lee, Seoul (KR);
Byeong-Chan Lee, Yongin-si (KR);
Sang-Bom Kang, Seoul (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 225 days.

(21) Appl. No.: 13/223,783

(22) Filed: Sep. 1, 2011

(65) Prior Publication Data

US 2012/0058609 A1      Mar. 8, 2012

(30) Foreign Application Priority Data

Sep. 2, 2010   (KR) .................. 10-2010-0085986

(51) Int. Cl.
*H01L 21/8238*       (2006.01)

(52) U.S. Cl.
USPC ........................... 438/199; 257/369; 438/478

(58) Field of Classification Search
USPC ........... 257/369, 411; 438/199, 216, 478, 595
See application file for complete search history.

(56) References Cited

U.S. PATENT DOCUMENTS

| 7,227,230 | B2 * | 6/2007 | Gambino et al. | 257/369 |
|---|---|---|---|---|
| 2004/0171201 | A1 * | 9/2004 | Gambino et al. | 438/184 |
| 2006/0014354 | A1 * | 1/2006 | Chen et al. | 438/369 |
| 2007/0007548 | A1 * | 1/2007 | Conti et al. | 257/202 |
| 2007/0096220 | A1 * | 5/2007 | Kim et al. | 257/382 |
| 2008/0308872 | A1 * | 12/2008 | Bu et al. | 257/369 |
| 2009/0179283 | A1 * | 7/2009 | Adams et al. | 257/411 |
| 2010/0078654 | A1 | 4/2010 | Okamoto | |
| 2010/0140674 | A1 * | 6/2010 | Luo et al. | 257/288 |
| 2011/0068396 | A1 * | 3/2011 | Cheng et al. | 257/335 |

FOREIGN PATENT DOCUMENTS

| JP | 2009-094225 | 4/2009 |
|---|---|---|
| JP | 2010-021240 | 1/2010 |

* cited by examiner

*Primary Examiner* — Errol Fernandes
(74) *Attorney, Agent, or Firm* — Lee & Morse, P.C.

(57) ABSTRACT

A method of manufacturing a semiconductor device includes forming first and second gate structures on a substrate in first and second regions, respectively, forming a first capping layer on the substrate by a first high density plasma process, such that the first capping layer covers the first and second gate structures except for sidewalls thereof, removing a portion of the first capping layer in the first region, removing an upper portion of the substrate in the first region using the first gate structure as an etching mask to form a first trench, and forming a first epitaxial layer to fill the first trench.

22 Claims, 31 Drawing Sheets

METHODS OF MANUFACTURING SEMICONDUCTOR DEVICES

CROSS-REFERENCE TO RELATED APPLICATIONS

Korean Patent Application No. 10-2010-0085986, filed on Sep. 2, 2010, in the Korean Intellectual Property Office, and entitled: "Semiconductor Devices and Methods of Manufacturing the Same," is incorporated by reference herein in its entirety.

BACKGROUND

1. Field

Example embodiments relate to semiconductor devices and methods of manufacturing the same. More particularly, example embodiments relate to methods of manufacturing semiconductor devices by a selective epitaxial growth (SEG) process and semiconductor devices manufactured by the methods.

2. Description of the Related Art

A semiconductor device may include source/drain regions adjacent to gate structures. Such source/drain regions may include epitaxial layers formed, e.g., by a SEG process. In order to perform the SEG process only on a given region of a substrate, a capping layer having a long incubation time may be used.

SUMMARY

Example embodiments provide a method of manufacturing a semiconductor device having good characteristics.

According to example embodiments, there is provided a method of manufacturing a semiconductor device, including forming first and second gate structures on a substrate in first and second regions, respectively, forming a first capping layer on the substrate by a first high density plasma process, such that the first capping layer covers the first and second gate structures except for sidewalls thereof, removing a portion of the first capping layer in the first region, removing an upper portion of the substrate in the first region using the first gate structure as an etching mask to form a first trench, and forming a first epitaxial layer to fill the first trench.

Forming the first capping layer may include using silicon oxide.

The first high density plasma process may be performed using silane ($SiH_4$) gas and oxygen ($O_2$) gas at a flow rate of about 10 sccm to about 10,000 sccm, under pressure of about 1 mTorr to about 100 mTorr, and at a power of about 10 W to about 10,000 W.

Forming the first capping layer may include using silicon nitride.

The first high density plasma process may be performed using silane ($SiH_4$) gas, and one of nitrogen ($N_2$) gas and ammonia ($NH_3$) gas, at a flow rate of about 10 sccm to about 10,000 sccm, under pressure of about 1 mTorr to about 100 mTorr, and at a power of about 10 W to about 10,000 W.

Forming the first capping layer may include forming sequentially stacked a first layer and a second layer, the first and second layers including silicon nitride and silicon oxide, respectively.

Forming the first epitaxial layer may include performing a selective epitaxial growth (SEG) process using a silicon-germanium source gas.

Performing the SEG process may further include using a p-type impurity source gas.

The method may further include forming a first elevated source drain (ESD) layer on the first epitaxial layer.

Forming the first ESD layer may include performing a SEG process using a silicon source gas and a p-type impurity source gas.

The method may further include removing a portion of the first capping layer remaining in the second region, forming a second capping layer on the substrate by a second high density plasma process, such that the second capping layer covers the first and second gate structures except for sidewalls thereof, removing a portion of the second capping layer in the second region, removing an upper portion of the substrate using the second gate structure as an etching mask to form a second trench, and forming a second epitaxial layer to fill the second trench.

Forming the second epitaxial layer may include performing a SEG process using a silicon source gas and a carbon source gas.

Performing the SEG process may further include using an n-type impurity source gas.

The method may further include forming a second ESD layer on the second epitaxial layer by performing a SEG process using a silicon source gas and an n-type impurity source gas.

The method may further include, after forming the first and second gate structures, forming first and second spacers on sidewalls of the first and second gate structures, respectively, such that the first capping layer is not formed on the first and second spacers.

The method may further include forming a third gate structure on a third region of the substrate, forming the first capping layer to cover the first, second, and third gate structures, except for sidewalls thereof, removing a portion of the first capping layer remaining in the second and third regions, after forming the first epitaxial layer, forming a second capping layer on the substrate by a second high density plasma process, such that the second capping layer covers first, second, and third gate structures except for sidewalls thereof, removing a portion of the second capping layer in the second and third regions, removing upper portions of the substrate in the second and third regions using the second and third gate structures as an etching mask to form second and third trenches, respectively, and forming second and third epitaxial layers to fill the second and third trenches, respectively.

Forming the first epitaxial layer may include performing a SEG process using a silicon-germanium source gas and a p-type impurity source gas.

Forming the second and third epitaxial layers may include performing a SEG process using a silicon source gas, a carbon source gas, and an n-type impurity source gas.

The method may further include forming a first ESD layer on the first epitaxial layer by a SEG process using a silicon source gas and a p-type impurity source gas, and forming second and third ESD layers on the second and third epitaxial layers, respectively, by a SEG process using a silicon source gas and an n-type source gas.

The third region may be a cell region, the first region may be a PMOS region of a peripheral circuit region, and the second region may be an NMOS region of the peripheral circuit region.

Forming the first capping layer may include forming discontinuous segments of the first capping layer on surfaces substantially parallel to a surface supporting the substrate.

Forming the first capping layer may include depositing material only on surfaces substantially parallel to a surface supporting the substrate.

According to other example embodiments, there is provided a method of manufacturing a semiconductor device, including forming first and second gate structures on a substrate in first and second regions, respectively, forming a first capping layer on the substrate by a first high density plasma process having a step coverage equal to or less than about 5%, such that the capping layer covers the substrate and the first and second gate structures, performing an anisotropic etching process on a portion of the first capping layer in the first region to form a first capping layer pattern on a sidewall of the first gate structure, removing an upper portion of the substrate in the first region using the first gate structure and the first capping layer pattern as an etching mask to form a first trench, and forming a first epitaxial layer to fill the first trench.

Forming the first capping layer may include using silicon oxide or silicon nitride.

Forming the first epitaxial layer may include performing a SEG process using a silicon-germanium source gas and a p-type impurity source gas.

The method may further include forming a first ESD layer on the first epitaxial layer by a SEG process using a silicon source gas and a p-type impurity source gas.

The method may further include performing an anisotropic etching process on a portion of the first capping layer in the second region to form a second capping layer pattern on a sidewall of the second gate structure, forming a second capping layer on the substrate, on which the first and second gate structures and the first and second capping layer patterns are formed, by a second high density plasma process having a step coverage equal to or less than about 5%, performing an anisotropic etching process on a portion of the second capping layer in the second region to form a third capping layer pattern on the second capping layer pattern, removing an upper portion of the substrate using the second gate structure and the second and third capping layer patterns as an etching mask to form a second trench, and forming a second epitaxial layer to fill the second trench.

Forming the first and second capping layers may include using substantially the same material, such that the second and third capping layer patterns are formed to be integral with each other.

The method may further include performing an anisotropic etching process on a portion of the second capping layer in the first region to form a fourth capping layer pattern on the first capping layer pattern.

Forming the first and second capping layers may include using substantially the same material, such that the first and fourth capping layer patterns are formed to be integral with each other.

The method may further include forming a second ESD layer on the second epitaxial layer by a SEG process using a silicon source gas and an n-type impurity source gas.

The method may further include forming a third gate structure in a third region of the substrate, forming the first capping layer on the substrate by a first high density plasma process having a step coverage equal to or less than about 5%, such that the first capping layer covers the first, second, and third gate structures, performing an anisotropic etching process on a portion of the first capping layer in the second and third regions, after forming the first epitaxial layer, to form second and third capping layer patterns on sidewalls of the second and third gate structures, respectively, forming a second capping layer on the substrate, on which the first, second, and third gate structures and the first, second, and third capping layer patterns are formed, by a second high density plasma process having a step coverage equal to or less than about 5%, performing an anisotropic etching process on a portion of the second capping layer in the second and third regions to form a fourth and fifth capping layer patterns on sidewalls of the second and third capping layer patterns, respectively, removing upper portions of the substrate in the second and third regions using the second and third gate structures and the second to fifth capping layer patterns as an etching mask to form second and third trenches, respectively, and forming second and third epitaxial layers to fill the second and third trenches, respectively.

The method may further include performing an anisotropic etching process on a portion of the second capping layer in the first region to form a sixth capping layer pattern on the first capping layer pattern.

The third region may be a cell region, the first region may be a PMOS region of a peripheral circuit region, and the second region may be an NMOS region of the peripheral circuit region.

Forming the first capping layer may include forming first layer portions on sidewalls of the gate structures and second layer portions on upper surfaces of the gate structures, such that each second portion layer is substantially thicker than a corresponding first layer portion.

Forming the first capping layer may include forming each first layer portion to have a thickness in a first direction that is lower than about 5% of a thickness of the gate structure in the first direction.

According to other example embodiments, there is provided a method of manufacturing a semiconductor device, including forming first and second gate structures on a substrate in first and second regions, respectively, forming a first capping layer on the substrate by a first high density plasma process having a step coverage equal to or less than about 5%, such that the capping layer covers the substrate and the first and second gate structures, removing a portion of the first capping layer in the first region, removing an upper portion of the substrate in the first region using the first gate structure as an etching mask to form a first trench, and forming a first epitaxial layer to fill the first trench.

Removing a portion of the first capping layer may include performing an anisotropic etching process on the portion of the first capping layer in the first region to form a first capping layer pattern on a sidewall of the first gate structure, such that a thickness of the first capping layer pattern in a first direction is lower than about 5% of a thickness of the gate structure in the first direction.

Forming the first capping layer may include using a first high density plasma process having a step coverage of about zero, such that the first capping layer is not formed on sidewalls of the first and second gate structures.

According to other example embodiments, there is provided a semiconductor device, including first and second gate structures on a substrate in first and second regions, respectively, first and second spacers on sidewalls of the first and second gate structures, respectively, first and second capping layer pattern structures on the first and second spacers, respectively, each of the first and second capping layer patterns having a thickness equal to or lower than about 5% of a thickness of the first and second spacers, respectively, and first and second source/drain regions at upper portions of the substrate adjacent to the first and second gate structures, respectively.

Each of the first and second capping layer pattern structures may have a thickness of about 10 Å or less.

Each of the first and second capping layer patterns may include silicon oxide or silicon nitride.

The first capping layer pattern structure may include first and second capping layer patterns sequentially stacked on a sidewall of the first gate structure, and the second capping layer pattern structure includes third and fourth capping layer patterns sequentially stacked on a sidewall of the second gate structure.

The and third capping layer patterns may include substantially the same material, and the second and fourth capping layer patterns include substantially the same material.

The first to fourth capping layer patterns may include substantially the same material.

Each of the first to fourth capping layer patterns may include a silicon nitride layer and a silicon oxide layer sequentially stacked.

The first source/drain region may include silicon-germanium doped with p-type impurities, and the second source/drain region includes silicon carbide doped with n-type impurities.

The semiconductor device may further include first and second ESD layers on the first and second source/drain regions, respectively.

The ESD layer may include silicon doped with p-type impurities, and the second EDS layer includes silicon doped with n-type impurities.

The semiconductor device may further include a third gate structure on a third region of the substrate, a third spacer on sidewalls of the third gate structure, a third capping layer pattern structure on the third spacer, the third capping layer pattern having a thickness equal to or less than about 5% of that of the third spacer and including silicon oxide or silicon nitride, third source/drain regions at upper portions of the substrate adjacent to the third gate structure, and a capacitor electrically connected to the third source/drain region.

The first source/drain region may include silicon-germanium doped with p-type impurities, and each of the second and third source/drain regions includes silicon carbide doped with n-type impurities.

The third region may be a cell region, the first region may be a PMOS region of a peripheral circuit region, and the second region may be an NMOS region of the peripheral circuit region.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE EMBODIMENTS

Figure 1:
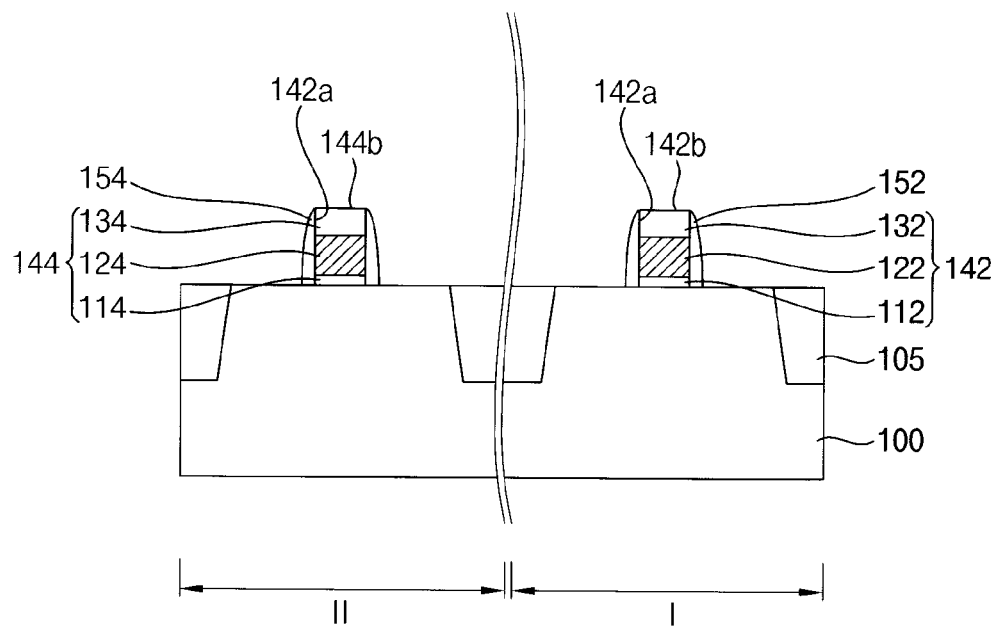
FIGS. 1 to 7 illustrate cross-sectional views of stages in a method of manufacturing a semiconductor device in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "between," "connected to," or "coupled to" another element or layer, it can be directly on, between, connected, or coupled to the other element or layer, or intervening elements or layers may be present. In contrast, when an element is referred to as being "directly on," "directly between," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 7 are cross-sectional views of stages a method of manufacturing a semiconductor device in accordance with example embodiments.

Referring to FIG. 1, first and second gate structures 142 and 144 may be formed on a substrate 100 having an isolation layer 105. The first and second gate structures 142 and 144 may be formed in first and second regions I and II of the substrate 100, respectively. In example embodiments, first and second spacers 152 and 154 may be further formed on sidewalls 142a and 144a of the first and second gate structures 142 and 144, respectively. For example, the first and second spacers 152 and 154 may cover, e.g., completely cover, and surround, e.g., completely surround, the first and second gate structure 142 and 144, respectively. For example, the first and second spacers 152 and 154 may extend only along the sidewalls 142a and 144a of the gate structures, so top surfaces 142b and 144b of the gate structures 142 and 144, respectively, may be exposed.

The substrate 100 may include a semiconductor substrate, e.g., a silicon substrate, a germanium substrate, or a silicon-germanium substrate, a silicon-on-insulator (SOI) substrate, a germanium-on-insulator (GOI) substrate, and the like. The substrate 100 may be divided into first and second regions I and II. In example embodiments, the first region I may be a positive channel metal oxide semiconductor (PMOS), and the second region II may be a negative channel metal oxide semiconductor (NMOS). The substrate 100 may further include a well region (not shown) including p-type impurities or n-type impurities. The isolation layer 105 may be formed e.g., by a shallow trench isolation (STI) process, in the substrate 100.

The first and second gate structures 142 and 144 may be formed by sequentially forming a gate insulation layer, a gate conductive layer, and a gate mask layer on the substrate 100, followed by patterning the gate mask layer, the gate conductive layer, and the gate insulation layer through a photolithography process. Thus, the first gate structure 142 may include a first gate insulation layer pattern 112, a first gate electrode 122, and a first gate mask 132 sequentially stacked on the substrate 100 in the first region I. The second gate structure 144 may include a second gate insulation layer pattern 114, a second gate electrode 124, and a second gate mask 134 sequentially stacked on the substrate 100 in the second region II.

For example, the gate insulation layer may be formed using an oxide, e.g., silicon oxide, or an oxynitride, e.g., silicon oxynitride. The gate insulation layer may be formed, e.g., by a thermal oxidation process or a chemical vapor deposition (CVD) process, on a top surface of the substrate 100. The gate conductive layer may be formed using, e.g., doped polysilicon, a metal, a metal nitride, and/or a metal silicide. The gate mask layer may be formed using, e.g., silicon nitride or silicon oxynitride. The gate conductive layer and the gate mask layer may be formed, e.g., by a CVD process, a physical vapor deposition (PVD) process, an atomic layer deposition (ALD) process, and the like.

The first and second spacers 152 and 154 may be formed by forming a spacer layer (not shown) on the gate masks 132 and 134, the gate electrodes 122 and 124, and the gate insulation layer patterns 112 and 114. The spacer layer may completely cover the first and second gate structures 142 and 144, followed by partially removing the spacer layer through an anisotropic etching process thereon. Portions of the spacer layer are removed, such that the first and second spacers 152 and 154 may be formed only on the sidewalls 142a and 144a of the first and second gate structures, respectively, to expose the top surfaces 142b and 144b of the first and second gate structures 142 and 144, respectively, and the top surface of the substrate 100. The spacer layer may be formed using a nitride, e.g., silicon nitride.

Figure 2A:
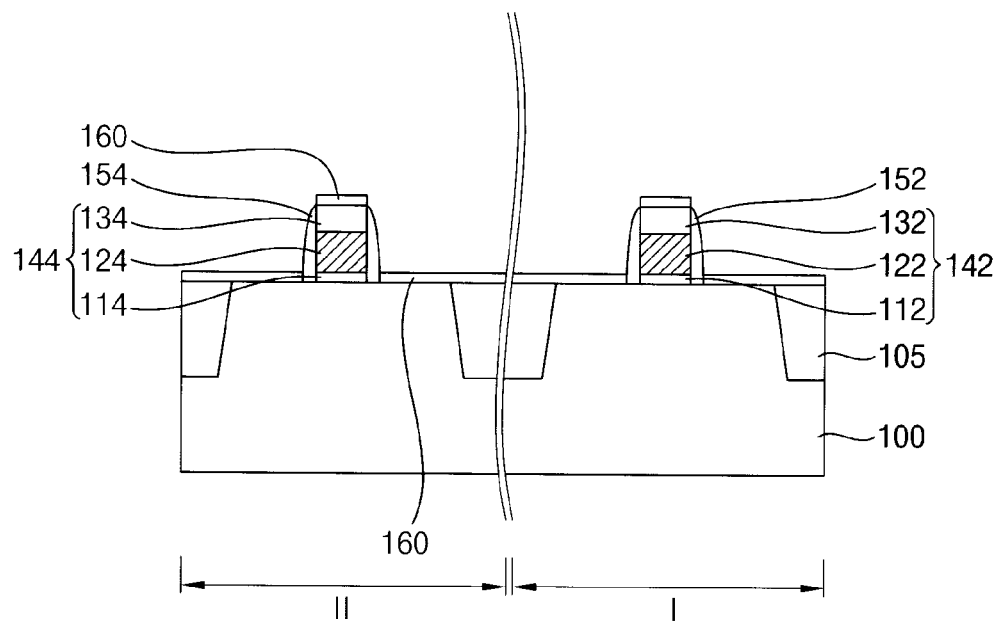

Referring to FIG. 2A, for example, a first high density plasma process having a substantially zero step coverage, i.e., substantially without material deposition on sidewalls, may be performed to form a single-layer capping layer, e.g., a first capping layer 160, on the first and second gate structures 142 and 144 and on the first and second spacers 152 and 154. In other words, the first high density plasma process may form the first capping layer 160 on, e.g., only on, surfaces substantially parallel to the top surface of the substrate 100, i.e., without material deposition on surfaces substantially perpendicular to the top surface of the substrate 100. Thus, the first capping layer 160 may be formed on, e.g., only on, the top surfaces 142b and 144b of the first and second gate structures 142 and 144, respectively, and on the top surface of the substrate 100, i.e., between adjacent gate structures. That is, the capping layer 160 may not be formed on the first and second spacers 152 and 154. If the spacers 152 and 154 are not formed on the first and second gate structures 142 and 144, respectively, the first capping layer 160 may not be formed on the sidewalls 142a and 144a of the first and second gate structures 142 and 144, respectively.

In example embodiments, the first high density plasma process may be performed using silane ($SiH_4$) gas and oxygen ($O_2$) gas as a source gas. In an example embodiment, each of the silane ($SiH_4$) gas and oxygen ($O_2$) gas may be provided at a flow rate of about 10 sccm to about 10,000 sccm, under pressure of about 1 mTorr to about 100 mTorr, and at a power of about 10 W to about 10,000 W. The source gas may be provided perpendicularly to the substrate 100, and the first capping layer 160 may have a substantially zero step coverage. As a result, the first capping layer 160 including silicon oxide may be formed only on the top surfaces 142b and 144b of the first and second gate structures 142 and 144, respectively, and on the substrate 100, e.g., only on a region between spacers of the first and second gate structures 142 and 144.

In other example embodiments, the first high density plasma process may be performed using silane ($SiH_4$) gas and nitrogen ($N_2$) gas (or ammonia ($NH_3$) gas) as a source gas. In an example embodiment, each of the silane ($SiH_4$) gas and nitrogen ($N_2$) gas (or ammonia ($NH_3$) gas) may be provided at a flow rate about 10 sccm to about 10,000 sccm, under pressure of about 1 mTorr to about 100 mTorr, at a power of about 10 W to about 10,000 W. The source gas may be provided perpendicularly to the substrate 100 to form the first capping layer 160 of silicon nitride only on the top surfaces 142b and 144b of the first and second gate structures 142 and 144, respectively, and on the substrate 100, e.g., only on regions between spacers of the first and second gate structures 142 and 144.

Figure 2B:
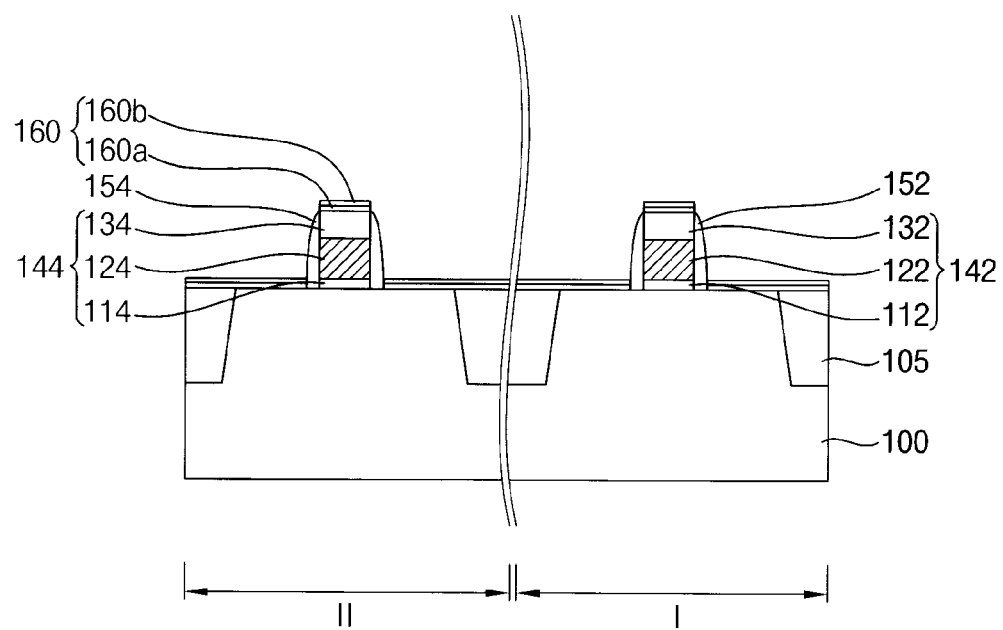

Referring to FIG. 2B, for example, the first high density plasma process having a substantially zero step coverage may be performed to form a multi-layered capping layer, e.g., a first capping layer 160' may be formed to have a first layer 160a and a second layer 160b sequentially stacked on the top surfaces of the first and second gate structures 142 and 144 and the substrate 100. In example embodiments, the first and second layers 160a and 160b may be a silicon nitride layer and a silicon oxide layer, respectively. The silicon nitride layer may have a low adhesion to masks 170 and 200 (refer to FIGS. 3 and 5 subsequently formed), and the silicon oxide layer may be formed on the silicon nitride layer so that subsequent processes using the masks 170 and 200 may be easily performed. Hereinafter, for convenience of explanation, only a single-layered capping layer 160 is illustrated.

Figure 3:
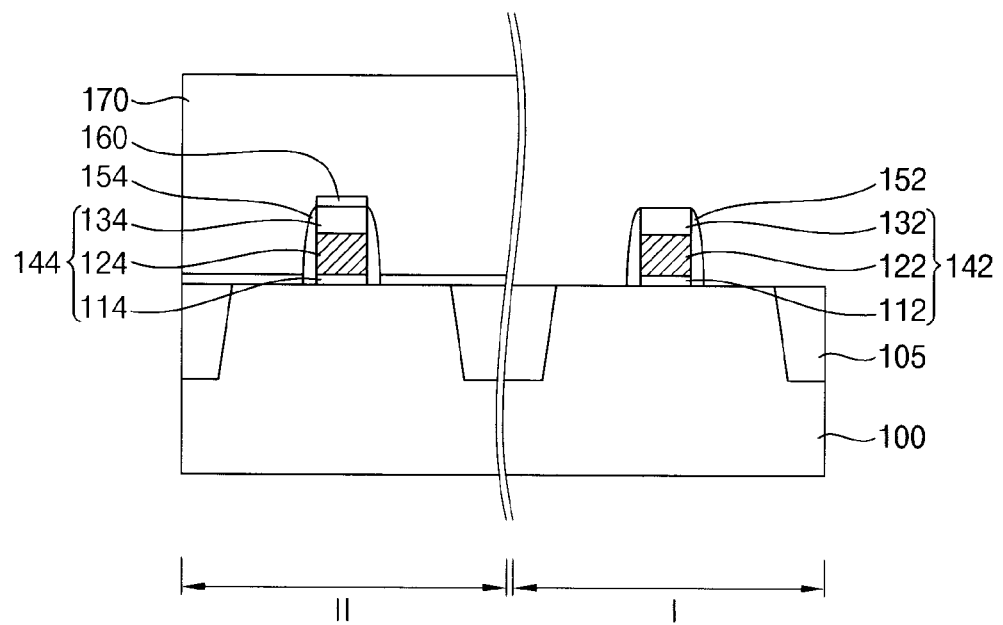

Referring to FIG. 3, the first mask 170 may be formed to cover the second region II. Next, a portion of the first capping layer 160 in the first region I may be removed using the first mask 170 as an etching mask, e.g., the first capping layer 160 may be completely removed from the first region I. In example embodiments, the portion of the first capping layer 160 may be removed, e.g., by an anisotropic etching process. As the first capping layer 160 is formed neither on the first spacer 152 nor on the sidewall 142a of the first gate structure 142, the portion of the first capping layer 160 in the first region I may be sufficiently, e.g., completely, removed.

Figure 4:
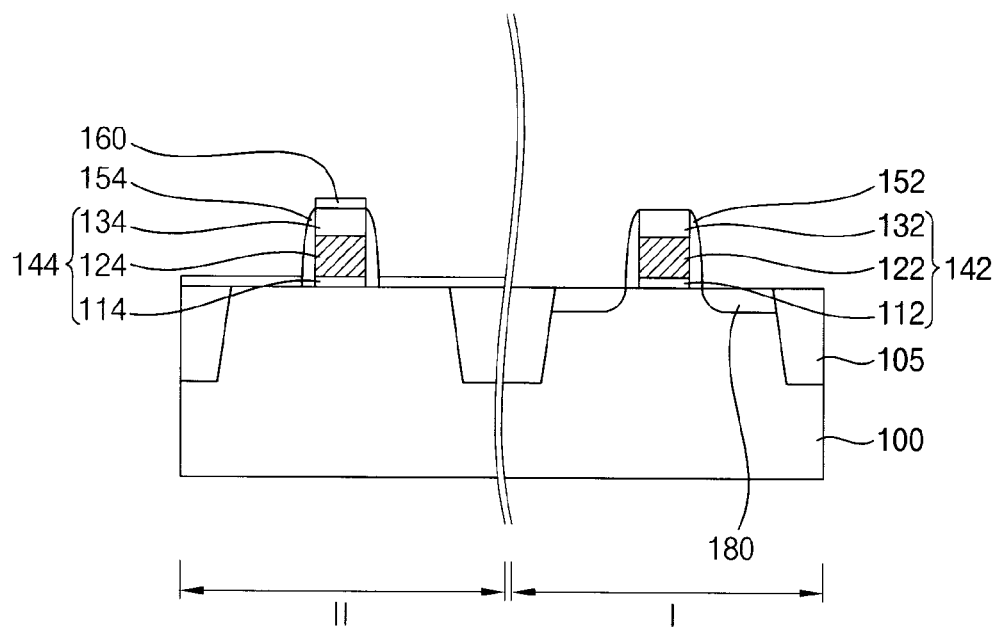

Referring to FIG. 4, an upper portion of the substrate 100 in the first region I may be removed to form a first trench (not shown) using the first mask 170, the first gate structure 142, and the first spacer 152 as an etching mask. A width of the first trench may extend between, e.g., may overlap and equal a distance between, the spacer 152 of the first gate structure 142 and the isolation layer 105. Next, the first mask 170 may be removed, followed by formation of a first epitaxial layer 180 to fill the first trench.

In example embodiments, a SEG process may be performed using a portion of the substrate 100 exposed by the first trench as a seed layer to form the first epitaxial layer 180. As a portion of the first capping layer 160 is maintained on the substrate 100 in the second region II, the first epitaxial layer 180 is formed only in the first region I of the substrate 100, i.e., the first capping layer 160 is preventing formation of an epitaxial layer in the second region II when the SEG process is performed.

In an example embodiment, the SEG process may be performed at a temperature of about 500° C. to about 900° C., under atmospheric pressure by a CVD process. The CVD process may be performed using a source gas, e.g., dichlorosilane ($SiH_2Cl_2$) gas, germane ($GeH_4$) gas, etc., so that a single crystalline silicon-germanium (SiGe) layer may be formed. In the CVD process, a p-type impurity source gas, such as diborane ($B_2H_6$) gas, may be also used to form a single crystalline silicon-germanium (SiGe) layer doped with impurities.

The first epitaxial layer 180 may serve as a first source/drain region, and may form a PMOS transistor together with the first gate structure 142. A portion of the first capping layer 160 in the second region II may be removed, e.g., the first capping layer 160 may be completely removed from the second region II of the substrate 100.

Figure 5:
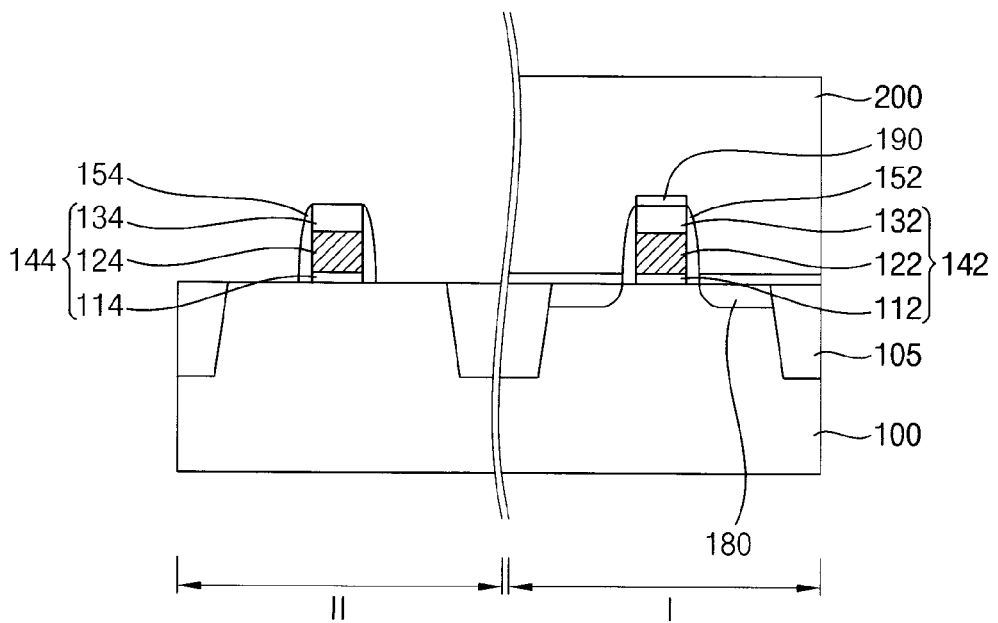

Referring to FIG. 5, a second high density plasma process having a substantially zero step coverage may be performed to form a second capping layer 190 on the top surfaces 142b and 144b of the first and second gate structures 142 and 144, respectively, and the substrate 100. The second capping layer 190 may not be formed on the spacers 152 and 154 or on sidewalls of the gate structures 142 and 144. In other words, the second capping layer 190 may be substantially the same as the first capping layer 160, with the exception of forming the second capping layer 190 after formation of the first epitaxial layer 180. Further, the second capping layer 190 may have a single layer structure or a multi-layer structure, e.g., including a silicon nitride layer and a silicon oxide layer, as described previously with reference to the first capping layer 160 in FIGS. 2A and 2B. The second high density plasma process may be performed under conditions substantially the same as or similar to those of the first high density plasma process, Next, a second mask 200 may be formed to cover the first region I, and a portion of the second capping layer 190 in the second region II may be removed using the second mask 200 as an etching mask. In example embodiments, the portion of the second capping layer 190 may be removed from the second region II by an anisotropic etching process.

Figure 6:
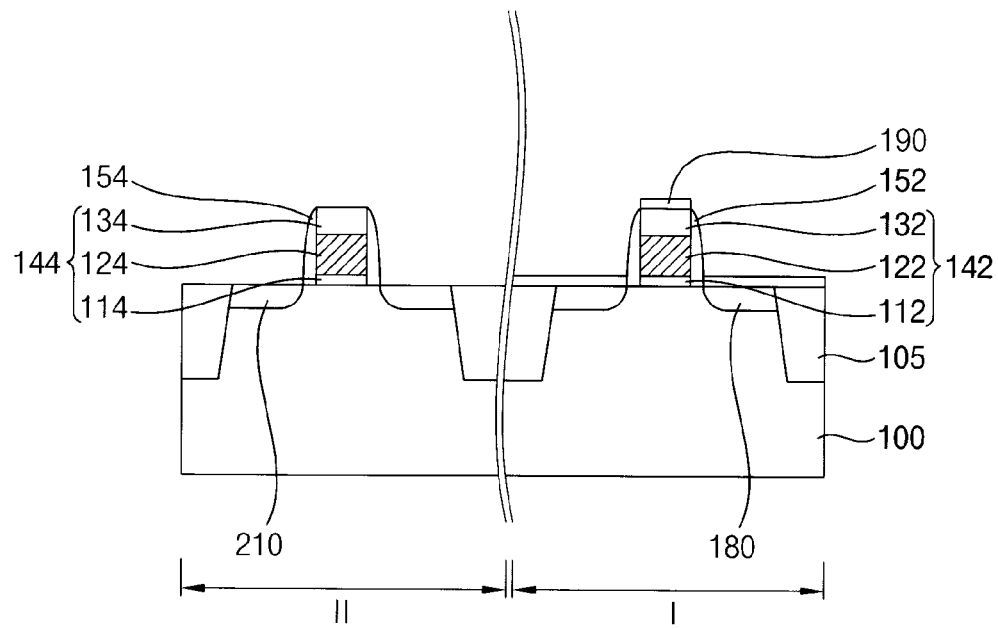

Referring to FIG. FIG. 6, an upper portion of the substrate 100 in the second region II may be removed to form a second trench (not shown) using the second mask 200, the second gate structure 144, and the second spacer 154 as an etching mask. The second mask 200 may be removed, and a second epitaxial layer 210 may be formed to fill the second trench.

In example embodiments, a SEG process may be performed using a portion of the substrate 100 exposed by the second trench as a seed layer to form the second epitaxial layer 210. As a portion of the second capping layer 190 remains in the first region I of the substrate 100, e.g., covering the top surface 142b of the first gate structure 142 and the first epitaxial layer 180, no further epitaxial growth may occur in the region I during the second SEG process.

In an example embodiment, the SEG process may be performed using a source gas, e.g., disilane (Si2H6) gas, methylsilane ($SiH_3CH_3$) gas, etc., so that a single crystalline silicon carbide (SiC) layer may be formed. In the SEG process, an n-type impurity source gas, e.g., phosphine ($PH_3$) gas, may be also used to form a single crystalline silicon carbide (SiC) layer doped with impurities.

The second epitaxial layer 210 may serve as a second source/drain region, and may form an NMOS transistor together with the second gate structure 144.

Figure 7:
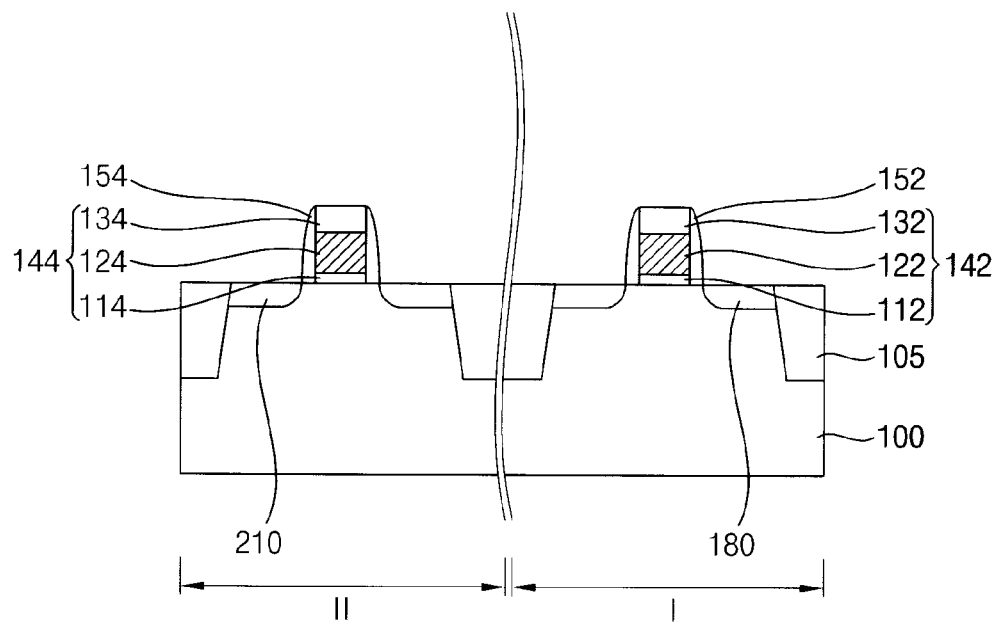

Referring to FIG. 7, a portion of the second capping layer 190 remaining in the first region I may be removed to manufacture the semiconductor device.

In the method of manufacturing the semiconductor device, the first and second capping layers 160 and 190 may be formed neither on the sidewalls of the first and second gate structures 142 an 144 nor on the spacers 152 and 154. That is, the first and second capping layers 160 and 190 may be formed only on top surfaces 142b and 144b of the first and second gate structures 142 and 144, respectively, and on the top surface of the substrate 100, e.g., between adjacent gate structures, so that the first and second capping layers 160 and 190 may not be formed on sidewalls or spacers of the gate structures. As such, the first and second capping layers 160 and 190 may be sufficiently, e.g., completely, removed by an anisotropic etching process after a SEG process, thereby improving high integration.

In contrast, when a conventional capping layer is formed on a sidewall or a spacer of a gate structure, it may be difficult to remove the entire capping layer from the sidewall of the gate structure after the SEG process. When the capping layer is not completely removed from a sidewalls or a spacer of a gate structure, a gap between adjacent gate structures may decrease. Further, a remaining portion of the conventional capping layer on the sidewalls or spacer may decrease a width of a trench formed in the substrate, thereby reducing the width, and subsequently, the volume of the conventional source/drain region of the grate structure.

Therefore, when the first and second capping layers 160 and 190, according to example embodiments, are formed with substantially zero step coverage, i.e., without material deposition on the sidewalls of the gate structures, no portions of the capping layers remain on the sidewalls after the SEG process. As such, the gap between the gate structures 142 and 144 may not be reduced, thereby increasing a high integration degree of the semiconductor device. Additionally, as trenches are formed using the gate structures 142 and 144 and the spacers 152 and 154 as an etching mask, and the first and second epitaxial layers 180 and 210 are formed in the trenches, the first and second epitaxial layers 180 and 210 may have an increased volume. Accordingly, the first and second epitaxial layers 180 and 210 may apply enlarged stress on the channel of the transistor to enhance the mobility of the carriers.

FIGS. 8 to 11 are cross-sectional views illustrating stages in a method of manufacturing a semiconductor device in accordance with other example embodiments. The method may be substantially the same as or similar to that illustrated with reference to FIGS. 1 to 7, except for further forming first and second elevated source drain (ESD) layers. Thus, like reference numerals refer to like elements, and repetitive explanations are omitted.

First, processes substantially the same as or similar to those illustrated with reference to FIGS. 1 to 4 may be performed.

Figure 8:
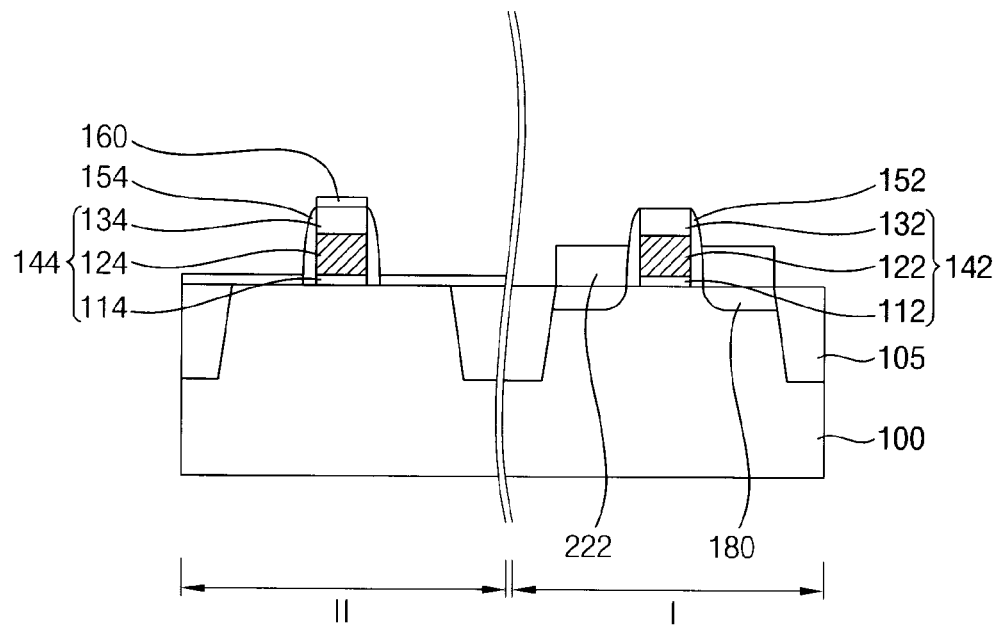
FIGS. 8 to 11 illustrate cross-sectional views of stages in a method of manufacturing a semiconductor device in accordance with other example embodiment.

Next, referring to FIG. 8, a SEG process may be performed to form a first ESD layer 222 on the first epitaxial layer 180. The SEG process may be performed using the first epitaxial layer 180 as a seed layer. In an example embodiment, the SEG process may be performed at a temperature of about 500° C. to about 900° C., under pressure of about 0.1 Torr to an atmospheric pressure, by a CVD process. The CVD process may be performed e.g., using dichlorosilane ($SiH_2Cl_2$) gas and diborane ($B_2H_6$) gas, so that a single crystalline silicon layer doped with impurities may be formed.

In example embodiments, the SEG process for forming the first epitaxial layer 180 and the SEG process for forming the first ESD layer 222 may be performed in-situ. That is, when the first epitaxial layer 180 is formed, after performing a SEG process by providing a silicon source gas, a germanium source gas, and a p-type impurity source gas, the provision of the germanium source gas may be stopped to form the first ESD layer 222.

A portion of the first capping layer 160 remaining in the second region II may be removed.

Figure 9:
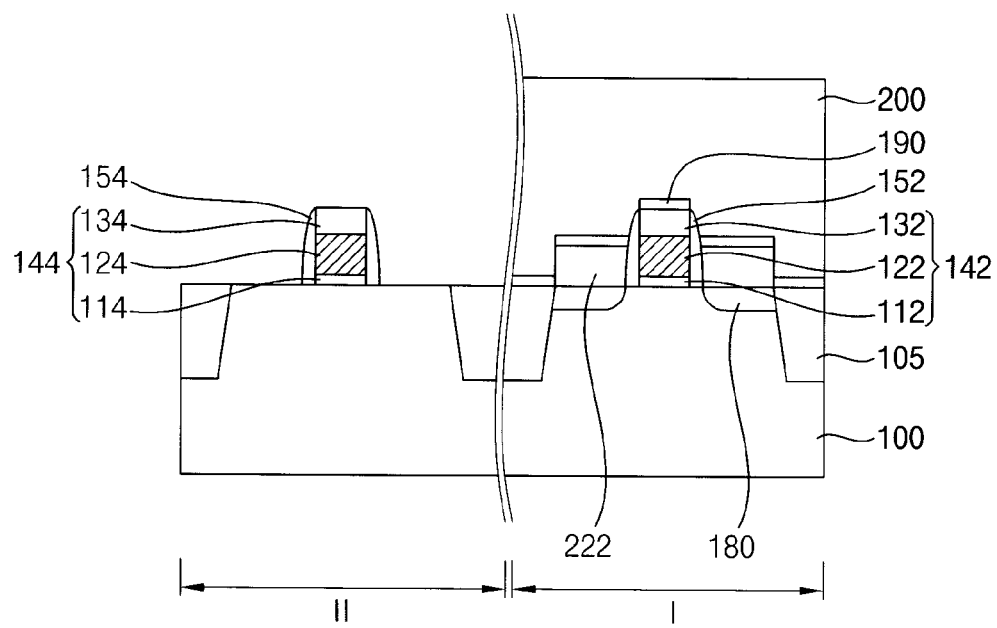

Referring to FIG. 9, a second high density plasma process having a substantially zero step coverage may be performed to form the second capping layer 190 on top surfaces of the first and second gate structures 142 and 144, the first ESD layer 222, and the substrate 100. After forming the second mask 200 covering the second region II, a portion of the second capping layer 190 in the second region II may be removed.

Figure 10:
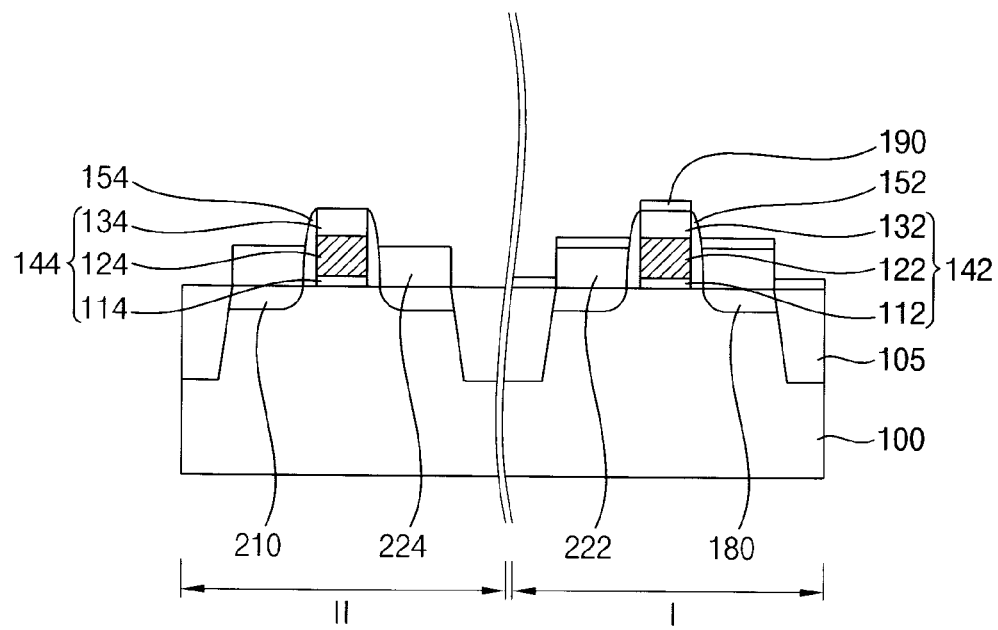

Referring to FIG. 10, an upper portion of the substrate 100 may be removed using the second mask 200, the second gate structure 144, and the second spacer 154 as an etching mask to form a second trench (not shown). After removing the second mask 200, the second epitaxial layer 210 may be formed to fill the second trench. In example embodiments, a SEG process may be performed using disilane ($Si_2H_6$) gas, methylsilane ($SiH_3CH_3$) gas, etc. as a source gas so that a single crystalline silicon carbide (SiC) layer may be formed. In the SEG process, an n-type impurity source gas such as phosphine ($PH_3$) gas may be also used to form a single crystalline silicon carbide (SiC) layer doped with impurities.

A SEG process may be performed to form a second ESD layer 224 on the second epitaxial layer 210. In example embodiments, the SEG process may be performed e.g., using dichlorosilane ($SiH_2Cl_2$) gas and phosphine ($PH_3$) gas, to form a single crystalline silicon layer doped with impurities.

In example embodiments, the SEG process for forming the second epitaxial layer 210 and the SEG process for forming the second ESD layer 224 may be performed in-situ. That is, when the second epitaxial layer 210 is formed, after performing a SEG process by providing a silicon source gas, a carbon source gas, and an n-type impurity source gas, the provision of the carbon source gas may be stopped to form the second ESD layer 224.

Figure 11:
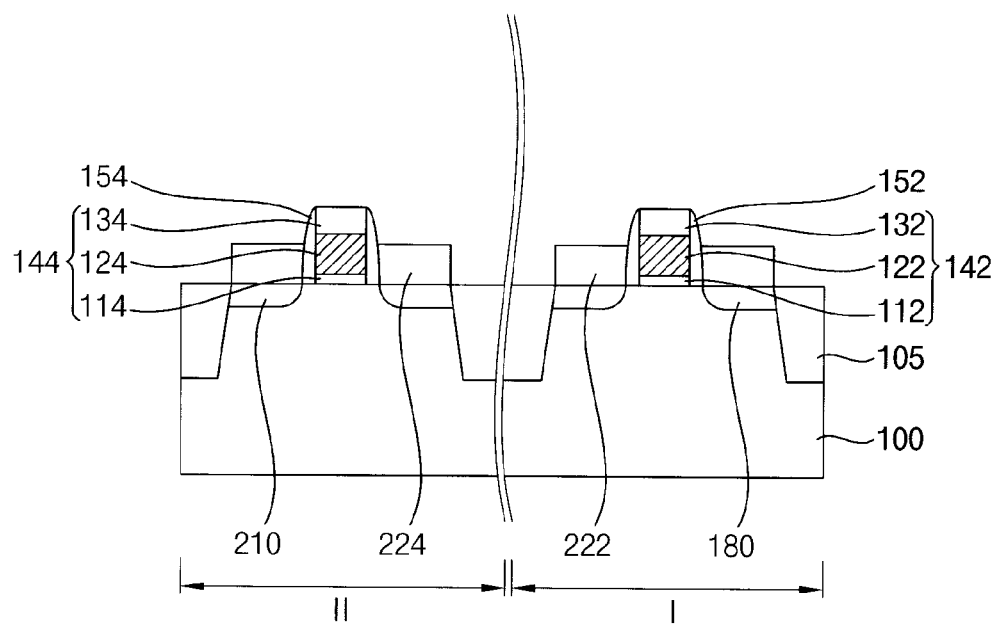

Referring to FIG. 11, a portion of the second capping layer 190 remaining in the first region I may be removed to manufacture the semiconductor device. The first epitaxial layer 180 and the first ESD layer 222 may serve as a source/drain region of a PMOS transistor, and the second epitaxial layer 210 and the second ESD layer 224 may serve as a source/drain region of an NMOS transistor.

FIGS. 12 to 17 are cross-sectional views illustrating a method of manufacturing a semiconductor device in accordance with other example embodiments. The method may be substantially the same as or similar to that illustrated with reference to FIGS. 1 to 7, except that a capping layer may be very thinly formed on a sidewall of a gate structure or a spacer.

Figure 12:
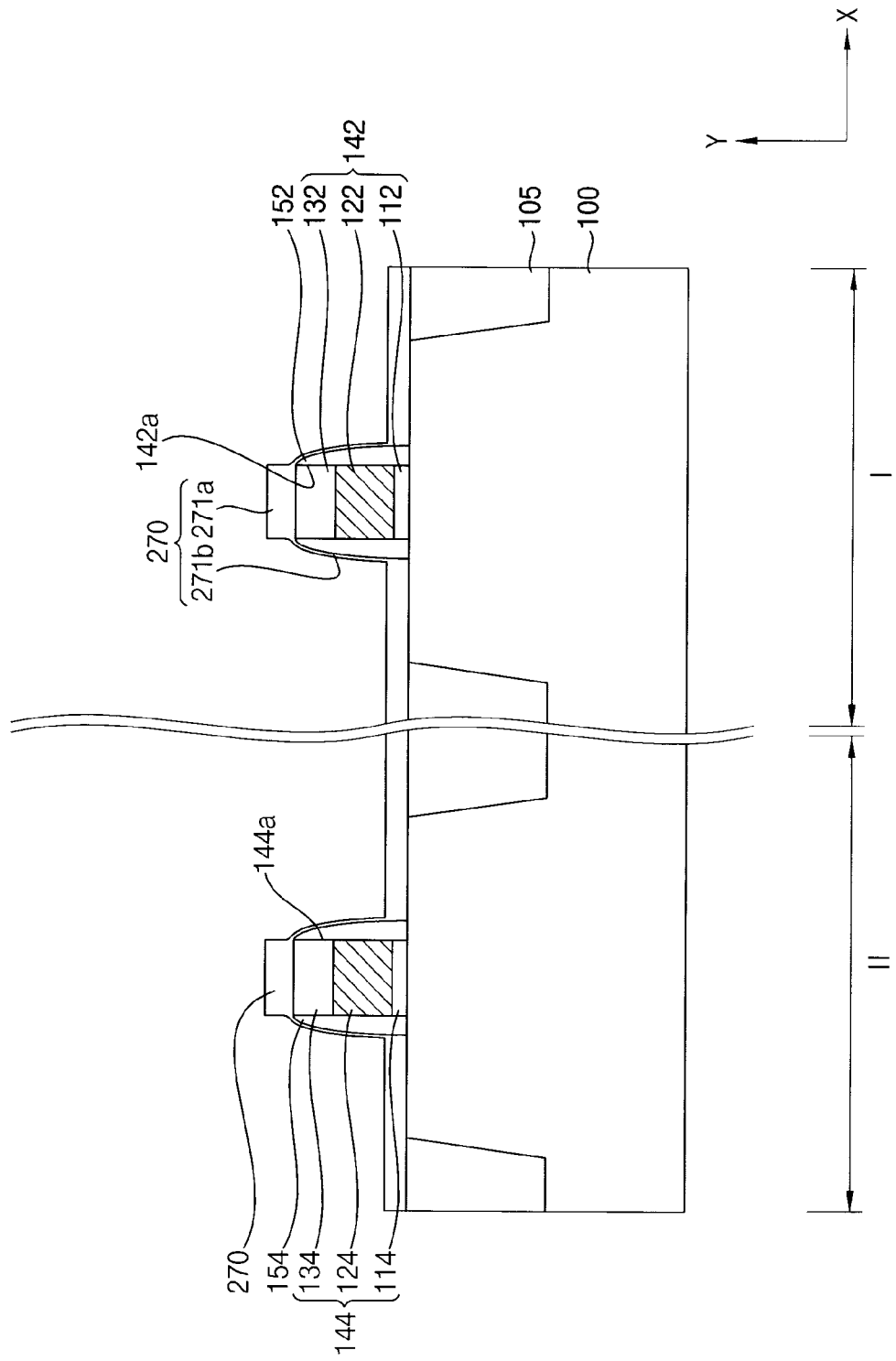
FIGS. 12 to 17 illustrate cross-sectional views of stages in a method of manufacturing a semiconductor device in accordance with other example embodiments.

Referring to FIG. 12, the first and second gate structures 142 and 144 may be formed on the substrate 100 having the isolation layer 105 thereon in the first and second regions I and II, respectively. In example embodiments, the first and second spacers 152 and 154 may be further formed on sidewalls of the first and second gate structures 142 and 144, respectively. The spacers 152 and 154 may be formed by forming a spacer layer covering the first and second gate structures 142 and 144 on the substrate 100, and performing an anisotropic etching process on the spacer layer. In an example embodiment, each of the first and second spacers 152 and 154 may be formed to have a thickness of about 200 Å.

A first high density plasma process having a very low step coverage, e.g., equal to or less than about 5%, may be performed to form a first capping layer 270 on the substrate 100 having the gate structures 142 and 144 and the spacers 152 and 154 thereon. Thus, the first capping layer 270 may be formed to have a substantially smaller thickness on the spacers 152 and 154 than that on top surfaces of the first and second gate structures 142 and 144 and the substrate 100.

When the spacers 152 and 154 are not formed, the first capping layer 270 may be formed to have a substantially smaller thickness directly on each of the sidewalls 142a and 144a of the first and second gate structures 142 and 144, respectively, than directly on top surfaces of the first and second gate structures 142 and 144 and the substrate 100. It is noted that a high density plasma process having a step coverage that is equal to or less than about 5% refers to deposition of material on a surface to a thickness of about 5% or less than a thickness of the surface, e.g., deposition of the first capping layer 270 on the spacer 152 to a thickness of about 5% or less than a thickness of the spacer 152, where the thicknesses are measured along the x-axis.

In detail, a first portion 271a of the first capping layer 270, i.e., a portion on the top surfaces 142b and 144b of respective first and second gate structures 142 and 144, may be substantially thicker than a second portion 271b of the first capping layer 270, i.e., a portion on sidewalls 142a and 144a of the first and second gate structures. For example, the first portion 271a may be at least about 20 times thicker than the second portion 271b. For example, the first portion 271a of the first capping layer 270 may have a thickness of about 240 Å, each of the gate structures 142 and 144 may have a thickness of about 2,500 Å, and the second portion 271b of the first capping layer 270 may have a thickness of about 10 Å or less.

In example embodiments, the first high density plasma process may be performed using silane ($SiH_4$) gas and oxygen ($O_2$) gas as a source gas. In an example embodiment, each one of the silane ($SiH_4$) gas and oxygen ($O_2$) gas may be provided at a flow rate about 10 sccm to about 10,000 sccm, under pressure of about 1 mTorr to about 100 mTorr, at a power of about 10 W to about 10,000 W. The source gas may be provided perpendicularly to the substrate 100, and the first capping layer 270 may have a very low step coverage. In other example embodiments, the first high density plasma process may be performed using silane ($SiH_4$) gas and nitrogen ($N_2$) gas (or ammonia ($NH_3$)) as a source gas. In an example embodiment, each of the silane ($SiH_4$) gas and nitrogen ($N_2$) gas (or ammonia ($NH_3$)) may be provided at a flow rate about 10 sccm to about 10,000 sccm, under pressure of about 1 mTorr to about 100 mTorr, at a power of about 10 W to about 10,000 W.

Figure 13:
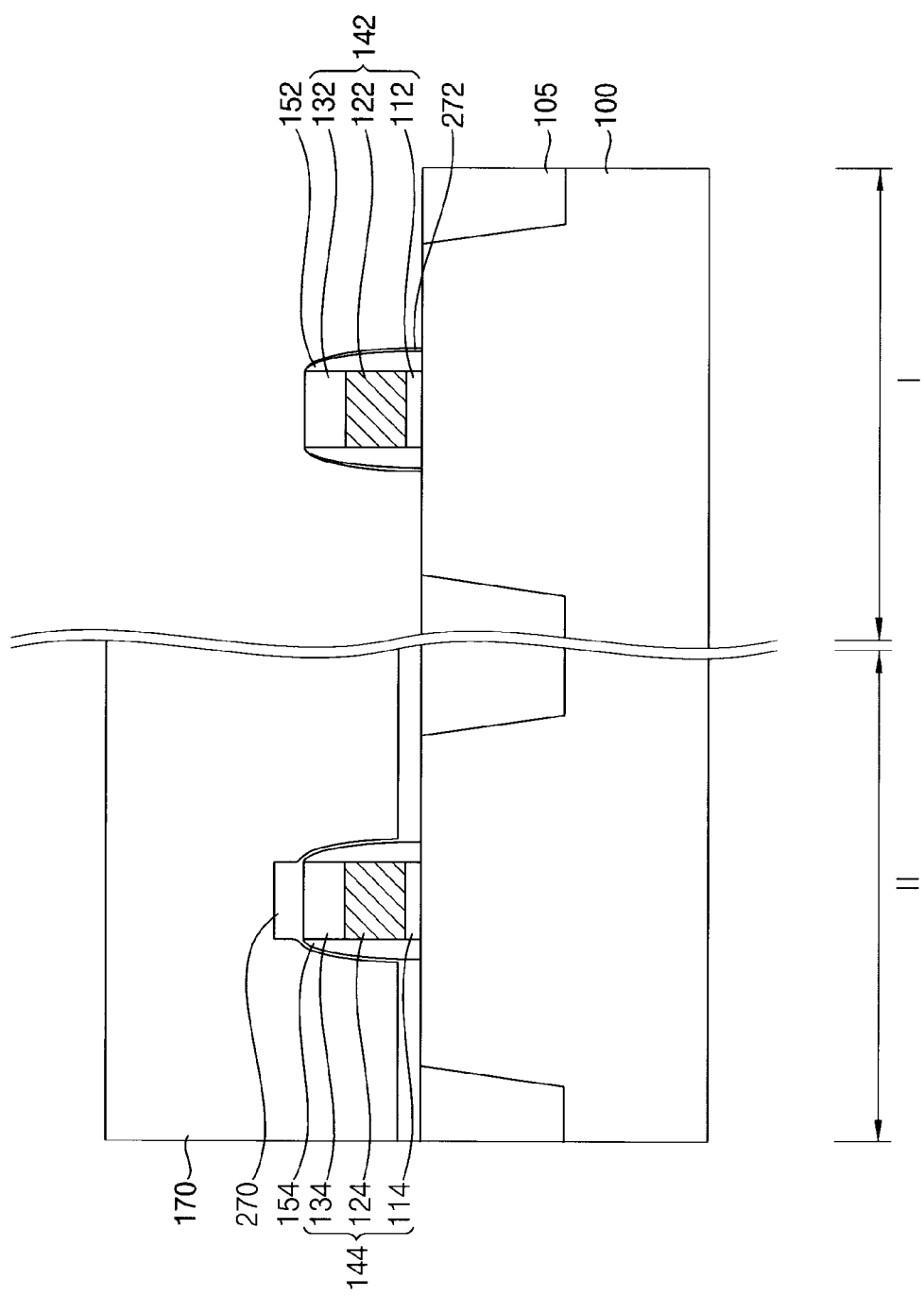

Referring to FIG. 13, after forming the first mask 170 covering the second region II, a portion of the first capping layer 270 in the first region I may be etched by an anisotropic etching process. Thus, a portion of the first capping layer 270 on the top surfaces of the first gate structure 142 and the substrate 100 in the first region I may be removed. As the second portion 271b of the capping layer 270, i.e., the portion on the first spacer 152, is very thin, even if a part of the second portion 271b remains on the first spacer 152 after the anisotropic etching process, the second portion 271b of the capping layer 270 remaining on the first spacer 152 may be defined as a first capping layer pattern 272. In an example embodiment, the first capping layer pattern 272 may have a thickness equal to or less than about 10 Å.

Figure 14:
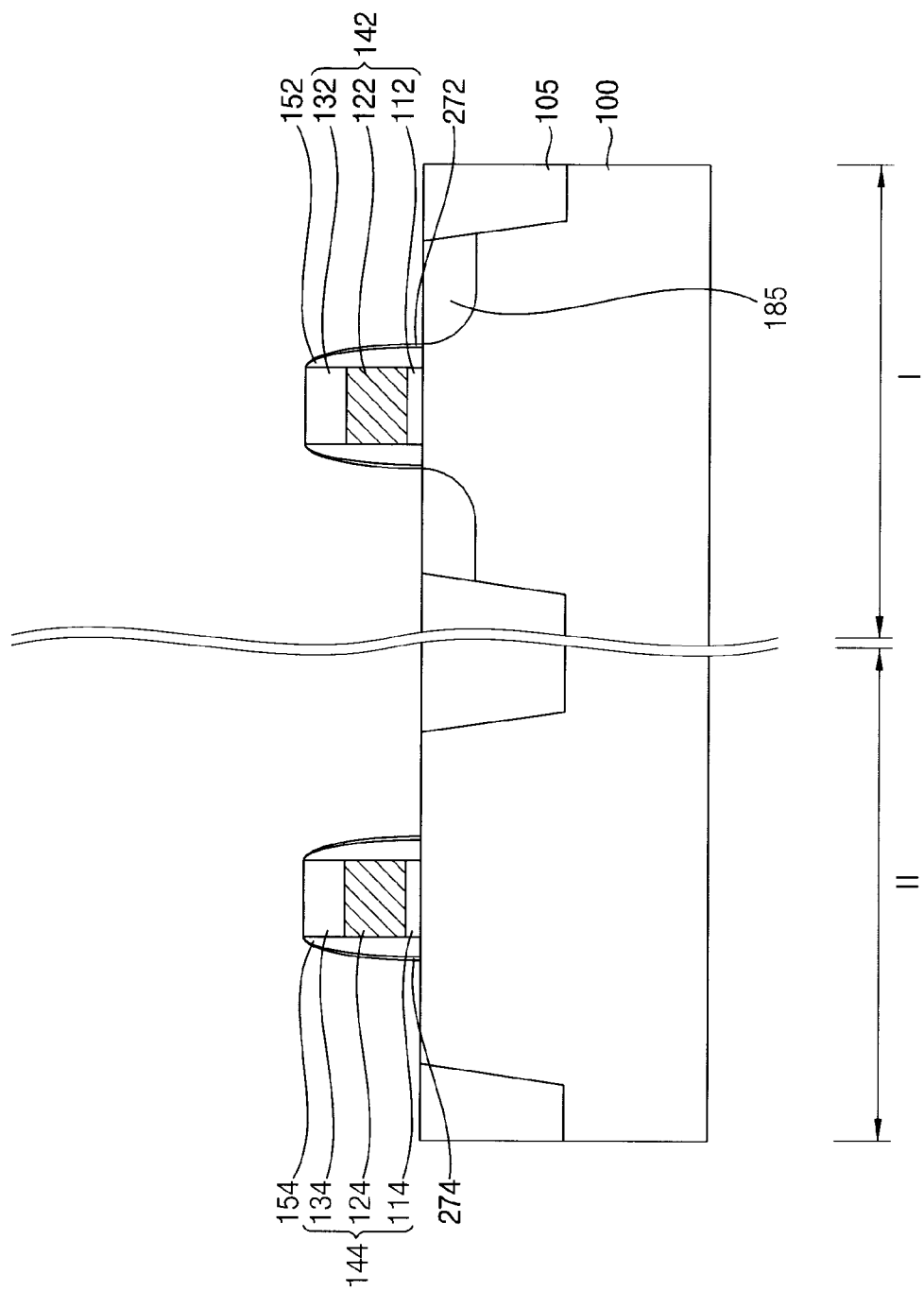

Referring to FIG. 14, an upper portion of the substrate 100 in the first region I may be removed using the first mask 170, the first gate structure 142, the first spacer 152, and the first capping layer pattern 272 as an etching mask to form a first trench (not shown). After removing the first mask 170, a first epitaxial layer 185 may be formed to fill the first trench. In example embodiments, a SEG process may be performed to form a single crystalline silicon-germanium layer doped with impurities filling the first trench.

A portion of the first capping layer 270 in the second region II may be etched by an anisotropic etching process. Thus, a portion of the first capping layer 270 on top surfaces of the second gate structure 144 and the substrate 100 in the second region II may be removed, and a second capping layer pattern 274 having a very thin thickness may remain on the second spacer 154.

Figure 15:
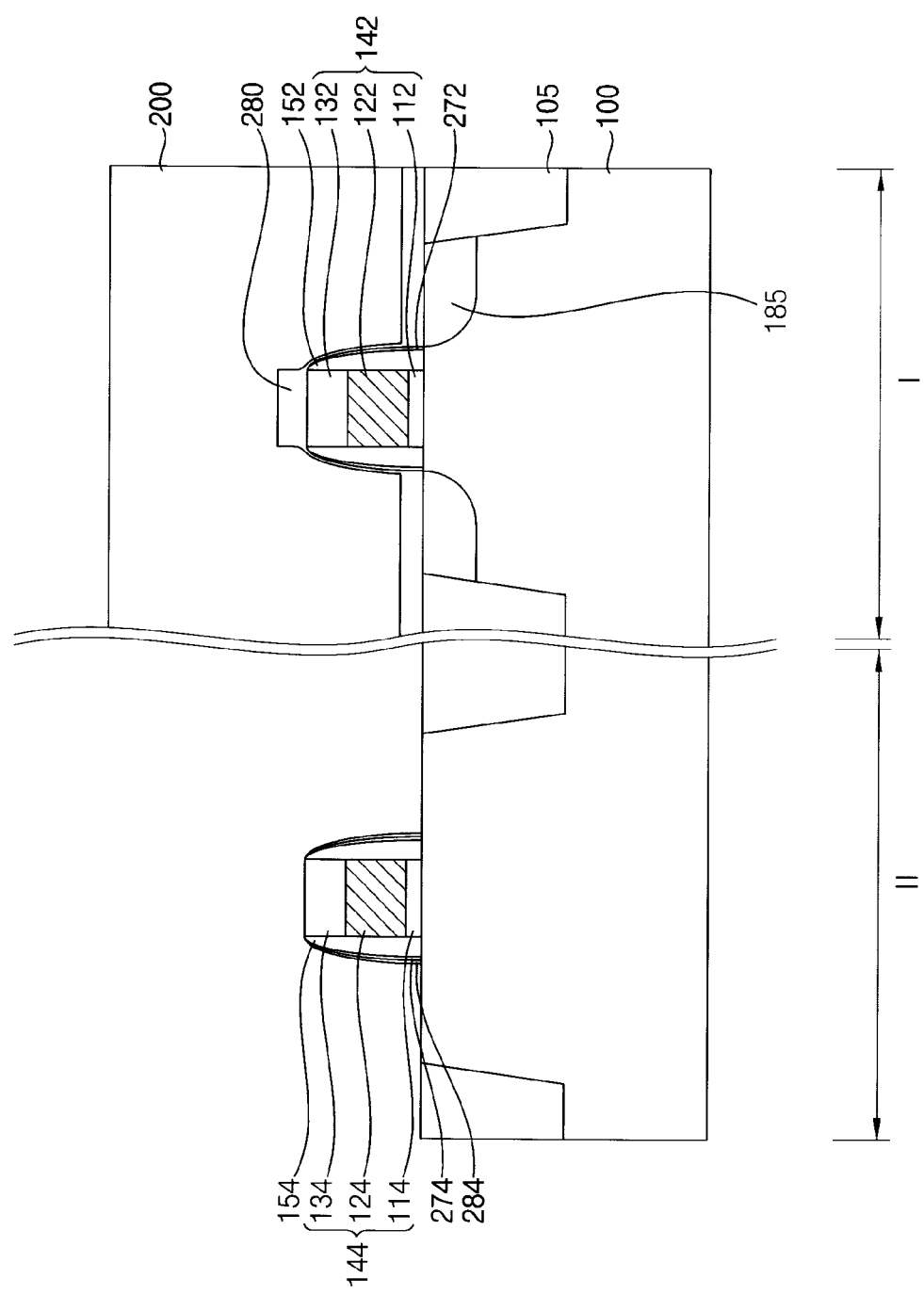

Referring to FIG. 15, a second high density plasma process having a very low step coverage equal to or less than about 5% may be performed to form a second capping layer 280 on the substrate 100 on which the gate structures 142 and 144, the spacers 152 and 154, and capping layer patterns 272 and 274 are formed. Thus, the second capping layer 280 may be formed on top surfaces of the gate structures 142 and 144 and the substrate 100, and on the capping layer patterns 272 and 274. The second capping layer 280 may be formed to have a thickness on the top surfaces of the gate structures 142 and 144 and the substrate 100 that is substantially smaller than that on the capping layer patterns 272 and 274.

After forming a second mask 200 covering the first region I, a portion of the second capping layer 280 in the second region II may be etched by an anisotropic etching process. Thus, a portion of the second capping layer 280 on top surfaces of the second gate structure 144 and the substrate 100, and a third capping layer pattern 284 having a very thin thickness may remain on the second capping layer pattern 274.

Figure 16:
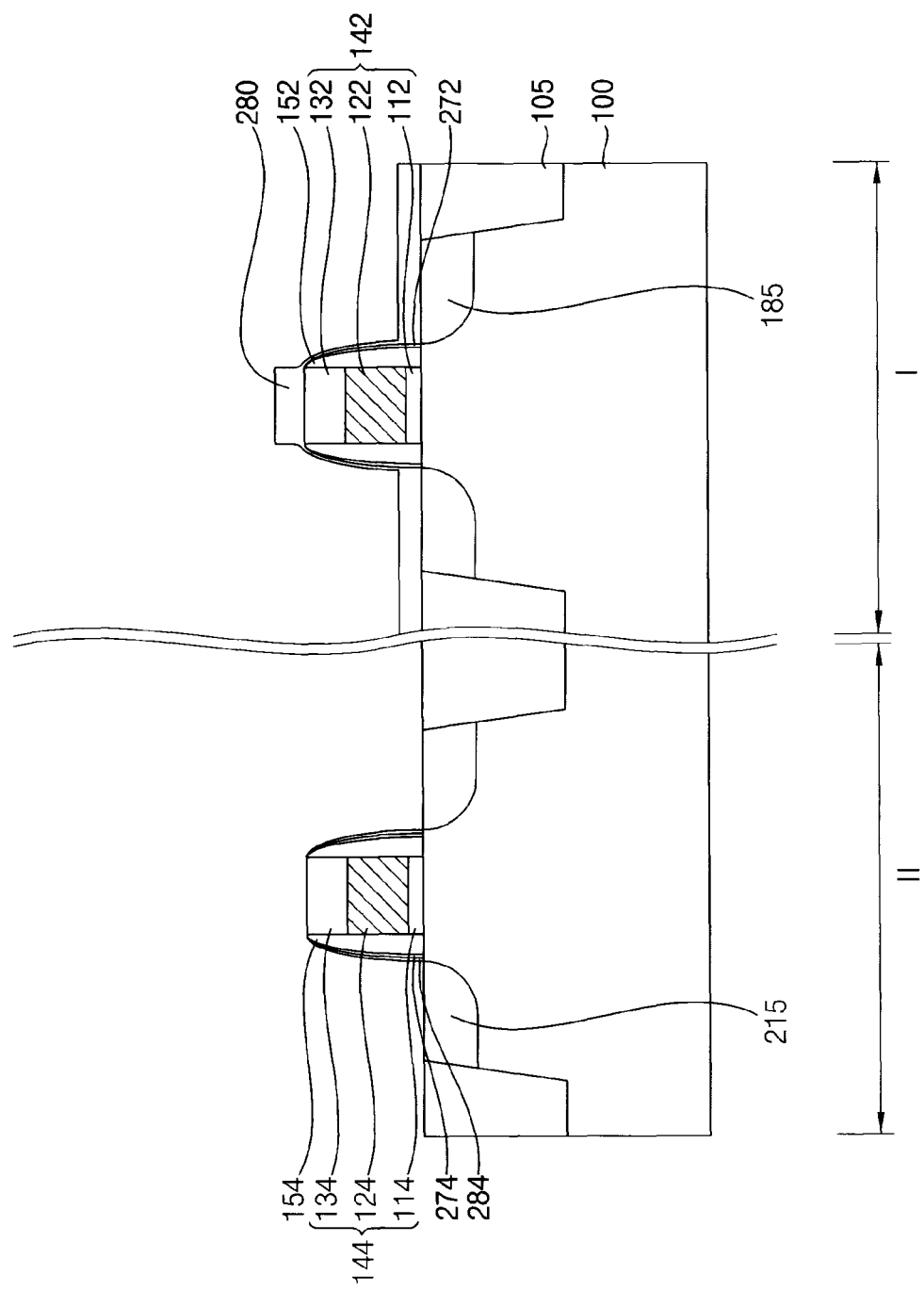

Referring to FIG. 16, an upper portion of the substrate 100 in the second region II may be removed using the second mask 200, the second gate structure 144, and the second and third capping layer patterns 274 and 284 as an etching mask to form a second trench (not shown). After removing the second mask 200, a second epitaxial layer 215 may be formed to fill the second trench. In example embodiments, a SEG process may be performed to form a single crystalline silicon carbide layer doped with impurities filling the second trench.

Figure 17:
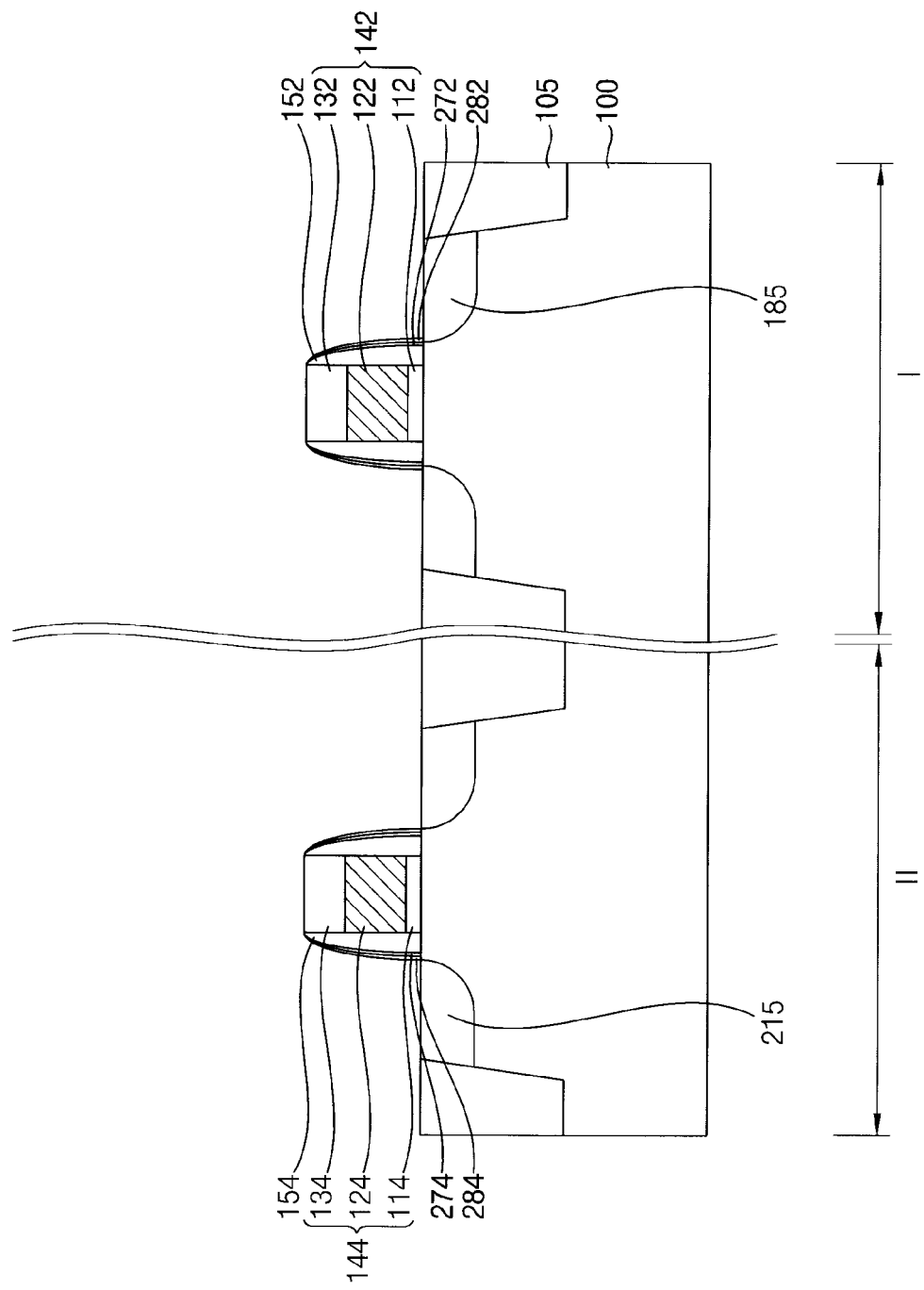
Figure 18:
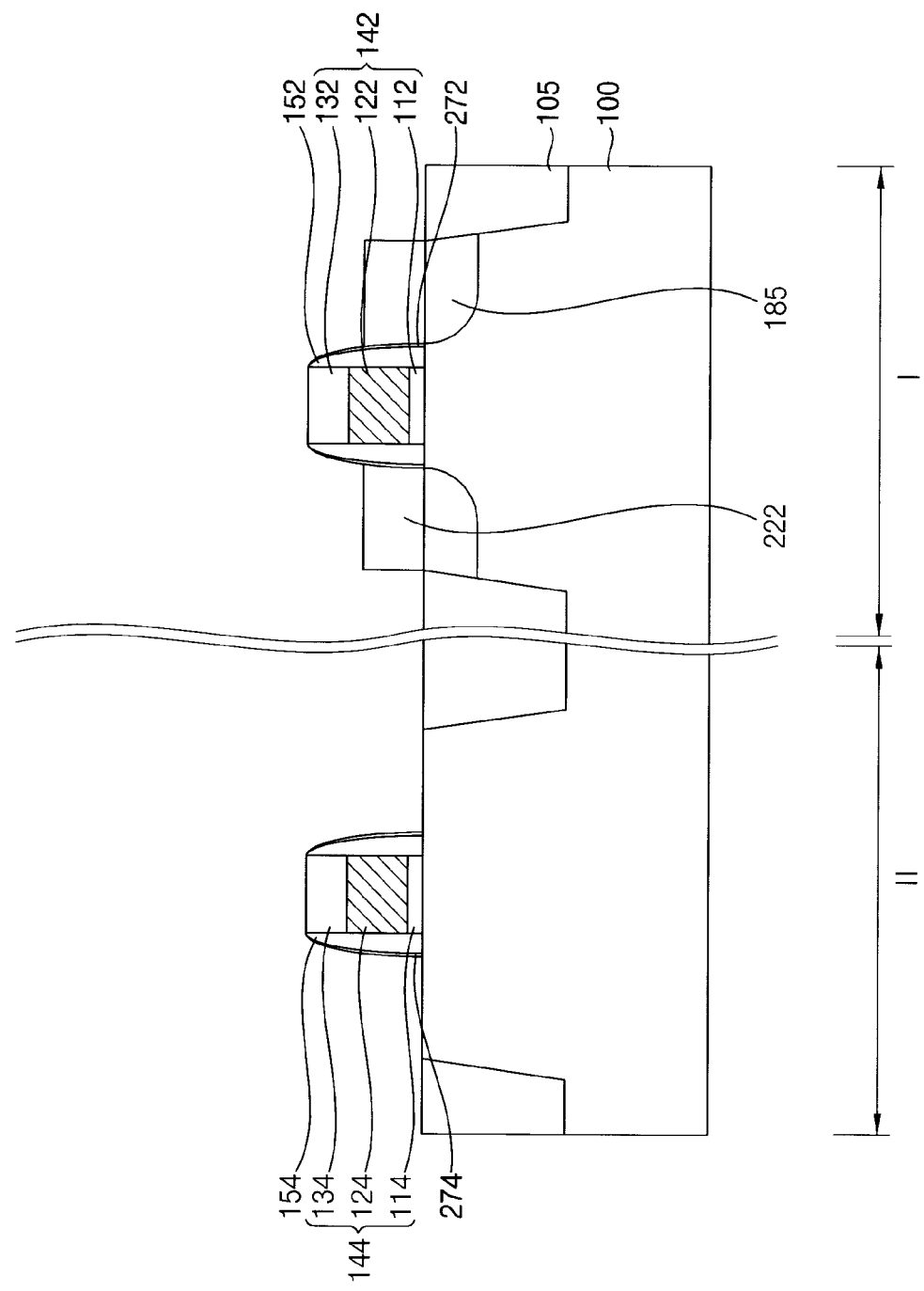
FIGS. 18 to 21 illustrate cross-sectional views of a method of manufacturing a semiconductor device in accordance with other example embodiments.

Referring to FIG. 17, a portion of the second capping layer 280 in the first region I may be etched by an anisotropic etching process to manufacture the semiconductor device. Thus, a portion of the second capping layer 280 on top surfaces of the first gate structure 142 and the substrate 100 in the first region I may be removed, and a fourth capping layer pattern 282 may remain on the first capping layer pattern 272.

In the method of manufacture the semiconductor device, the high density plasma processes may not have a substantially zero step coverage unlike that illustrated with reference to FIGS. 1 to 7. However, the plasma processes may have a very low step coverage that is equal to or less than about 5%, so that only capping layer patterns 272, 274, 284, and 282 having very thin thicknesses may remain on spacers 152 and 154 when the capping layers 270 and 280 are etched by an anisotropic etching process. Thus, the gap between the gate structures 142 and 144 may not be reduced, so that the semiconductor device may have a high integration degree and the epitaxial layers 185 and 215 may have an increased volume. Accordingly, the epitaxial layers 185 and 215 may apply enlarged stress on the channel of the transistor to enhance the mobility of the carriers.

Meanwhile, the first and fourth capping layer patterns 272 and 282 may be defined as a first capping layer pattern structure, and the second and third capping layer patterns 274 and 284 may be defined as a second capping layer pattern structure.

FIGS. 18 to 21 are cross-sectional views illustrating a method of manufacturing a semiconductor device in accordance with other example embodiments. The method may be substantially the same as or similar to that illustrated with reference to FIGS. 12 to 17, except for further forming first and second ESD layers.

First, processes substantially the same as or similar to those illustrated with reference to FIGS. 11 to 14 may be performed.

A SEG process may be performed to form a first ESD layer 222 on the first epitaxial layer 184. In example embodiments, a single crystalline silicon layer doped with impurities as the first ESD layer 222 may be formed.

A portion of the first capping layer 270 in the second region II may be etched by an anisotropic etching process, and a second capping layer pattern 274 having a very thin thickness may remain on the second spacer 154.

Figure 19:
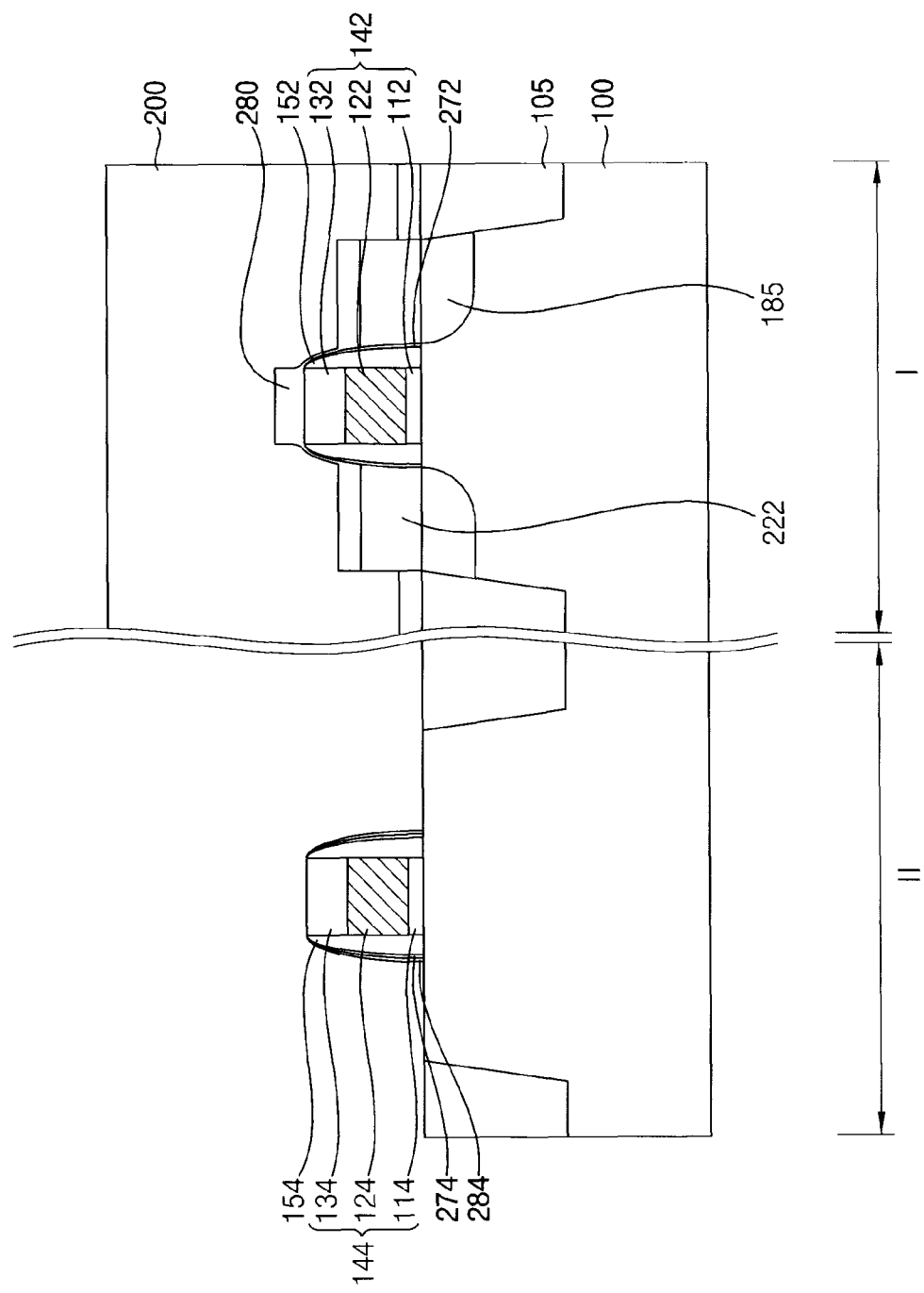

Referring to FIG. 19, a second high density plasma process having a very low step coverage equal to or less than about 5% may be performed to form a second capping layer 280 on the substrate 100 on which the first and second gate structures 142 and 144, the first and second spacers 152 and 154, the first and second capping layer patterns 272 and 274, and the first ESD layer 222 are formed. Thus, the second capping layer 280 may be formed on top surfaces of the first and second gate structures 142 and 144, the substrate 100, and the first ESD layer 222, and on the first and second capping layer patterns 272 and 274.

After forming a second mask 200 covering the first region I, a portion of the second capping layer 280 in the second region II may be etched by an anisotropic etching process, and a third capping layer pattern 284 having a very thin thickness may remain on the second capping layer pattern 274.

Figure 20:
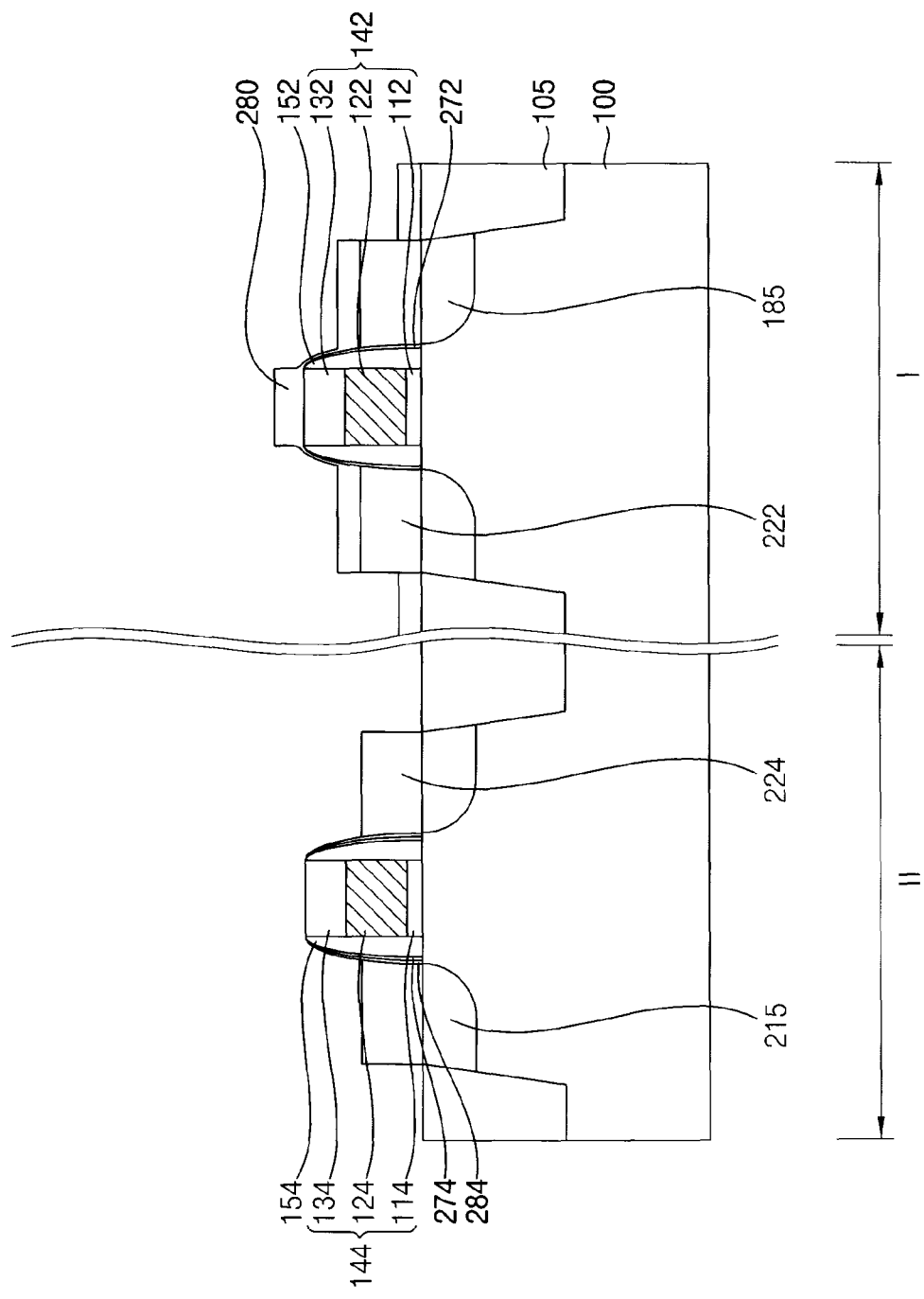

Referring to FIG. 20, an upper portion of the substrate 100 in the second region II may be removed using the second mask 200, the second gate structure 144, and the second and third capping layer patterns 274 and 284 as an etching mask to form a second trench (not shown). After removing the second mask 200, a second epitaxial layer 215 may be formed to fill the second trench. In example embodiments, a single crystalline silicon carbide (SiC) layer as the second epitaxial layer 215 may be formed. A SEG process may be performed to form a second ESD layer 224 on the second epitaxial layer 215. In example embodiments, a single crystalline silicon layer doped with impurities as the second ESD layer 224 may be formed.

Figure 21:
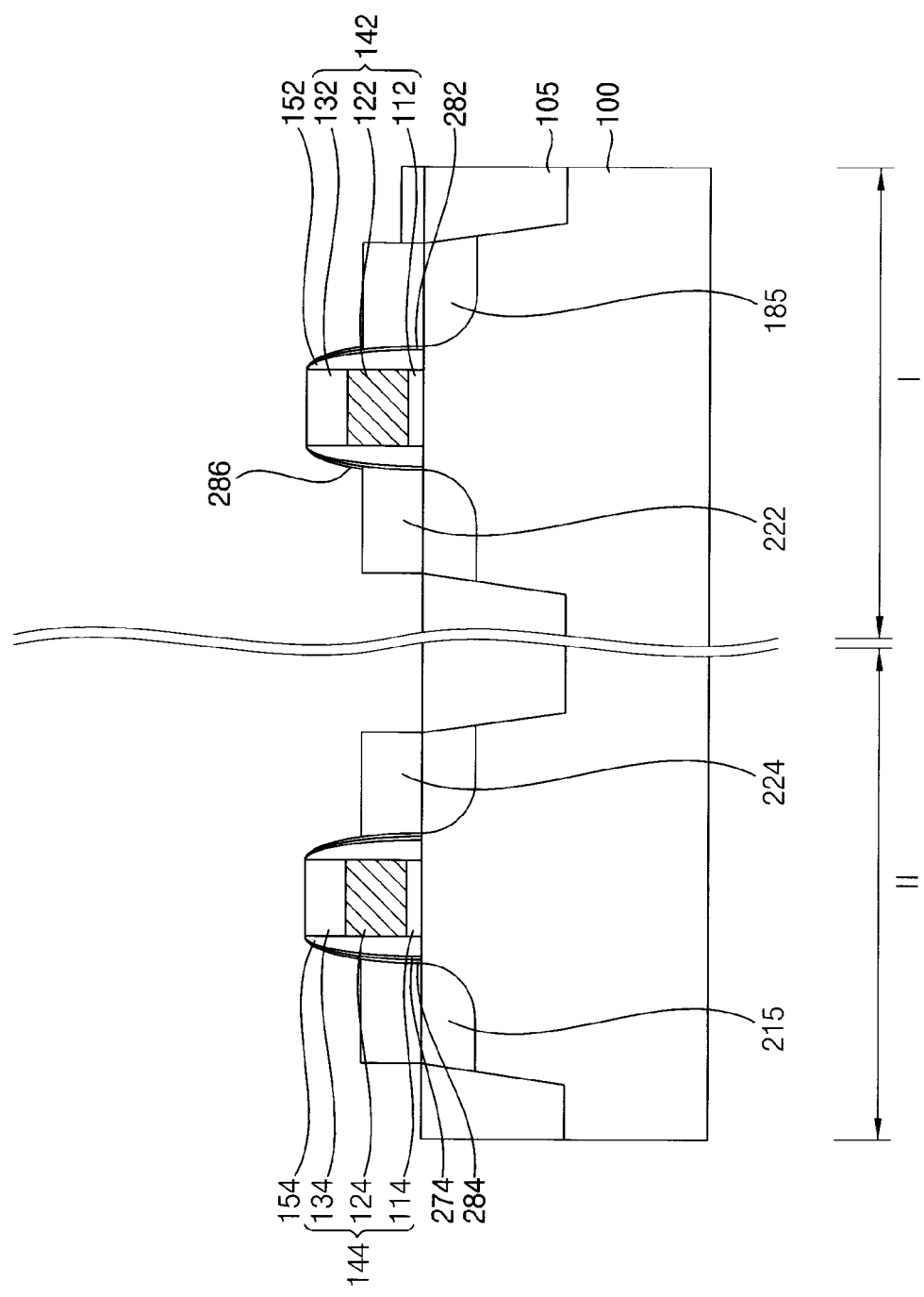

Referring to FIG. 21, a portion of the second capping layer 280 remaining in the first region I may be etched by an anisotropic etching process to form a fourth capping layer pattern 282 having a very thin thickness on the first capping layer pattern 272.

FIGS. 22 to 25 are cross-sectional views illustrating a method of manufacturing a semiconductor device in accordance with other example embodiments. The method may be substantially the same as or similar to that illustrated with reference to FIGS. 12 to 17, except that the capping layers include a multi-layered structure of a silicon oxide layer and a silicon nitride layer.

Figure 22:
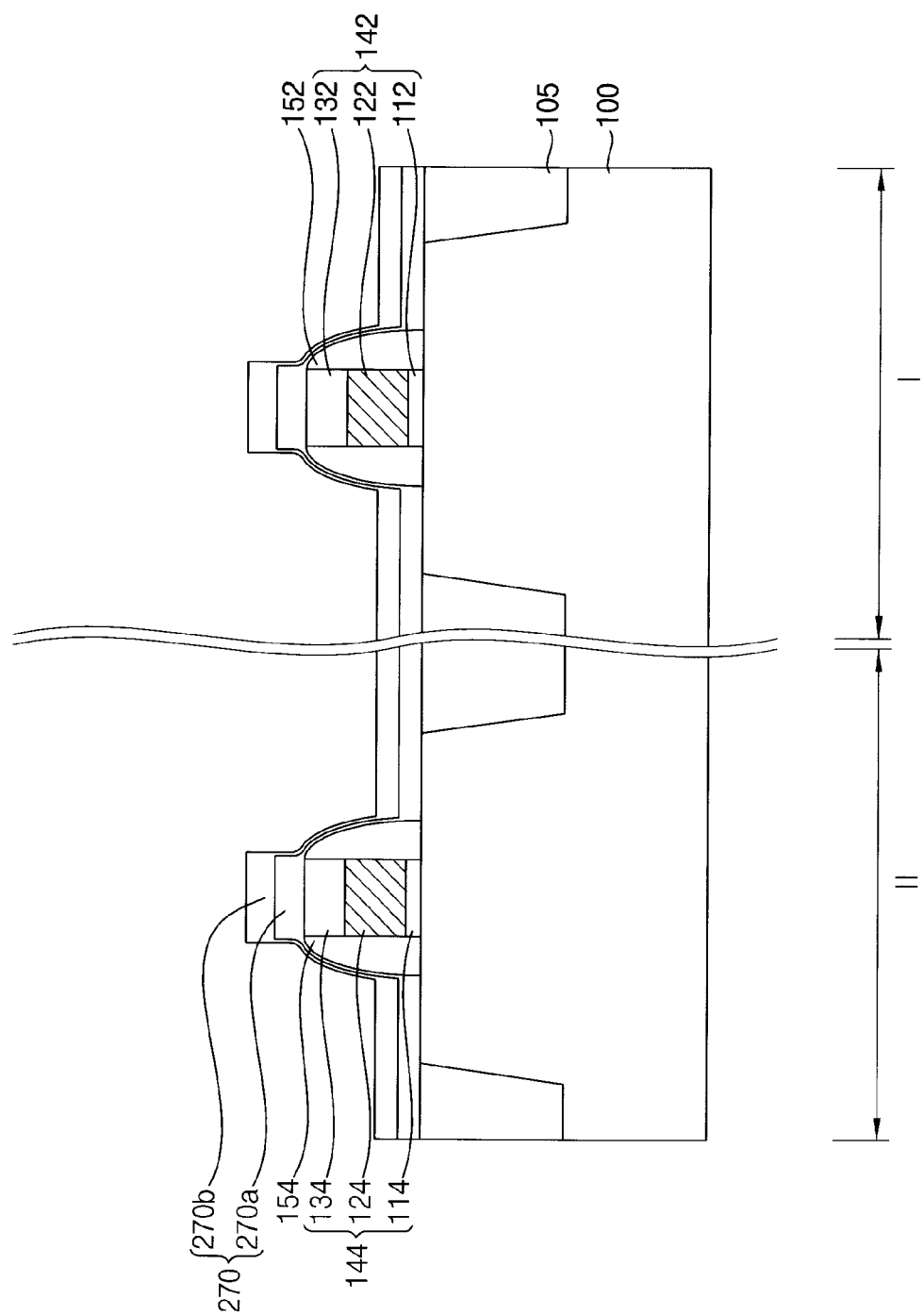
FIGS. 22 to 25 illustrate cross-sectional views of stages in a method of manufacturing a semiconductor device in accordance with other example embodiments.

Referring to FIG. 22, the first and second gate structures 142 and 144 and the first and second spacers 152 and 154 may be formed on the substrate 100 having the isolation layer 105 thereon in the first and second regions I and II, respectively.

The first high density plasma process having a very low step coverage equal to or less than about 5% may be performed to form the first capping layer 270 on the substrate 100 having the first and second gate structures 142 and 144 and the first and second spacers 152 and 154. Thus, the first capping layer 270 may be formed on the top surfaces of the first and second gate structures 142 and 144 and the substrate 100, and on the first and second spacers 152 and 154. The first capping layer 270 may be formed on the spacers 152 and 154 to have a substantially smaller thickness than that on the top surfaces of the first and second gate structures 142 and 144 and the substrate 100.

In example embodiments, the first high density plasma process may include a first process for forming a first layer 270a by providing silane ($SiH_4$) gas and nitrogen ($N_2$) gas (or ammonia ($NH_3$)) as a source gas, and a second process for forming a second layer 270b by providing silane ($SiH_4$) gas and oxygen ($O_2$) gas as a source gas. Thus, the first layer 270a may include silicon nitride, and the second layer 270b may include silicon oxide.

Figure 23:
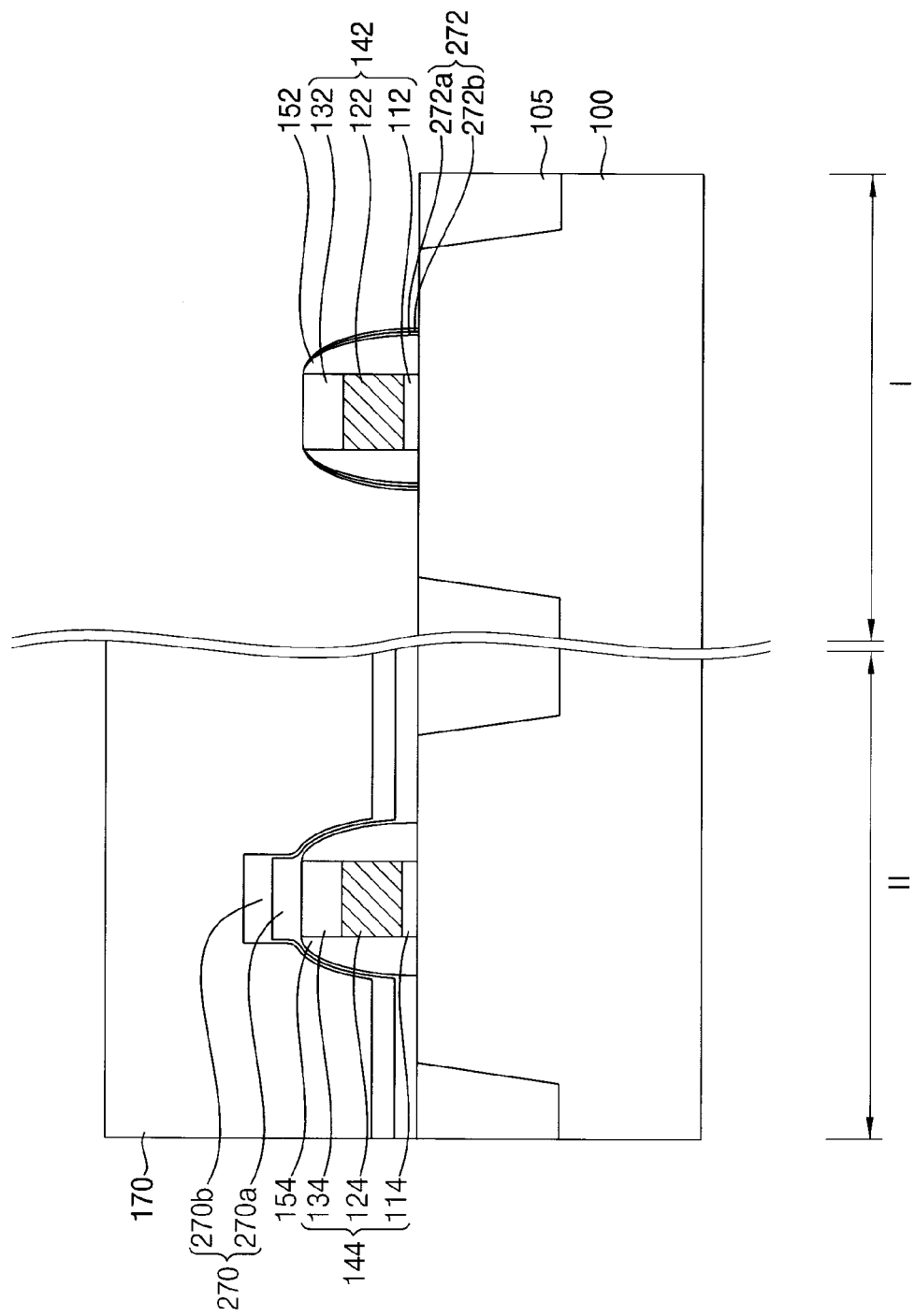

Referring to FIG. 23, after forming the first mask 170 covering the second region II, a portion of the first capping layer 270 in the first region I may be etched by an anisotropic etching process. Thus, the first capping layer pattern 272 having a very thin thickness may be formed on the first spacer 152. The first capping layer pattern 272 may have first and second patterns 272a and 272b including silicon nitride and silicon oxide, respectively.

Figure 24:
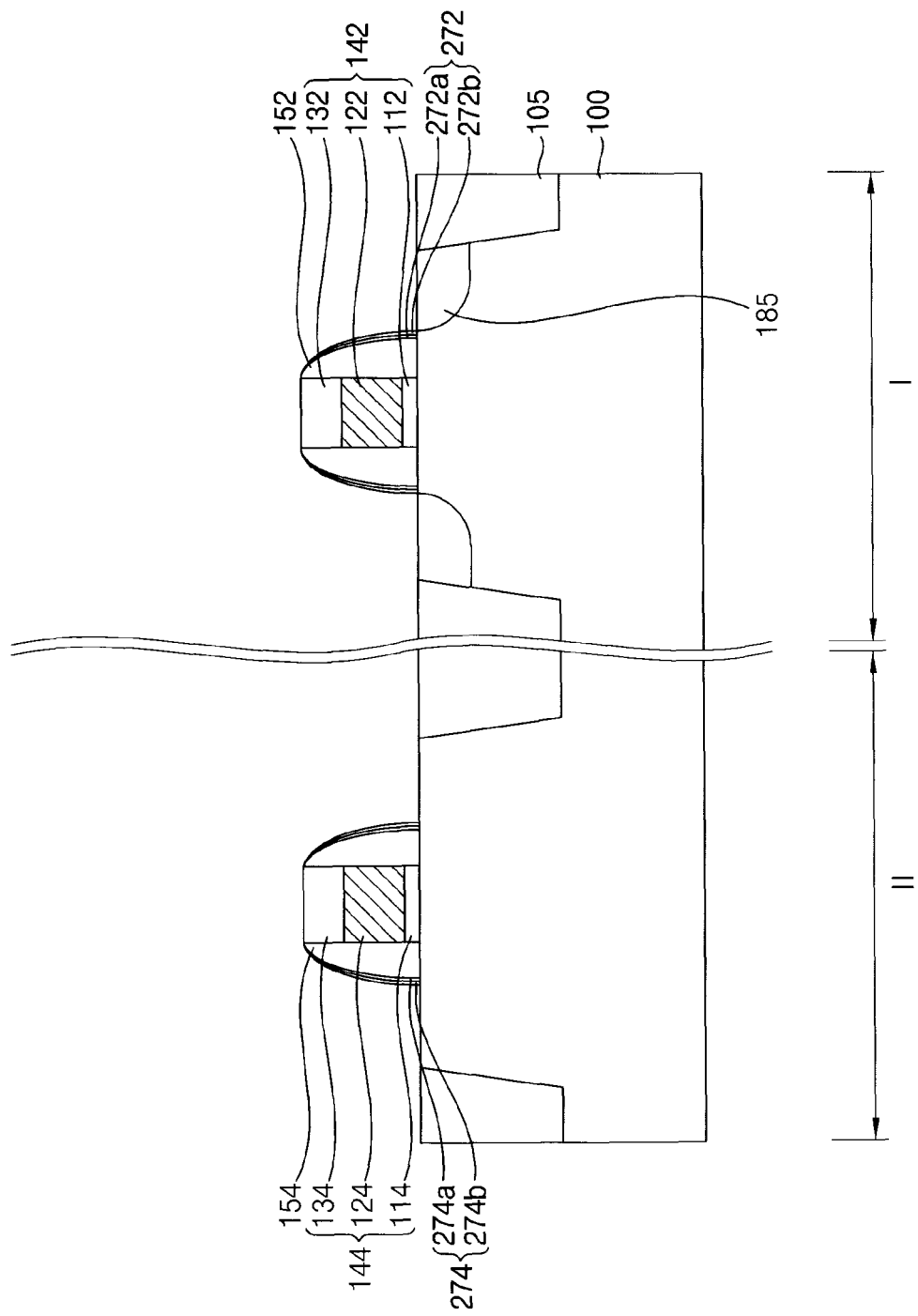

Referring to FIG. 24, an upper portion of the substrate 100 in the first region I may be removed using the first mask 170, the first gate structure 142, the first spacer 152, and the first capping layer pattern 272 as an etching mask to form the first trench (not shown). After removing the first mask 170, the first epitaxial layer 185 may be formed to fill the first trench. In example embodiments, a single crystalline silicon-germanium layer doped with impurities filling the first trench may be formed as the first epitaxial layer 185.

Then, processes substantially the same as or similar to those illustrated with reference to FIG. 14 may be performed. That is, a portion of the first capping layer 270 in the second region II may be etched by an anisotropic etching process. Thus, the second capping layer pattern 274 having a very thin thickness may remain on the second spacer 154. The second capping layer pattern 274 may have third and fourth patterns 274a and 274b including silicon nitride and silicon oxide, respectively.

Figure 25:
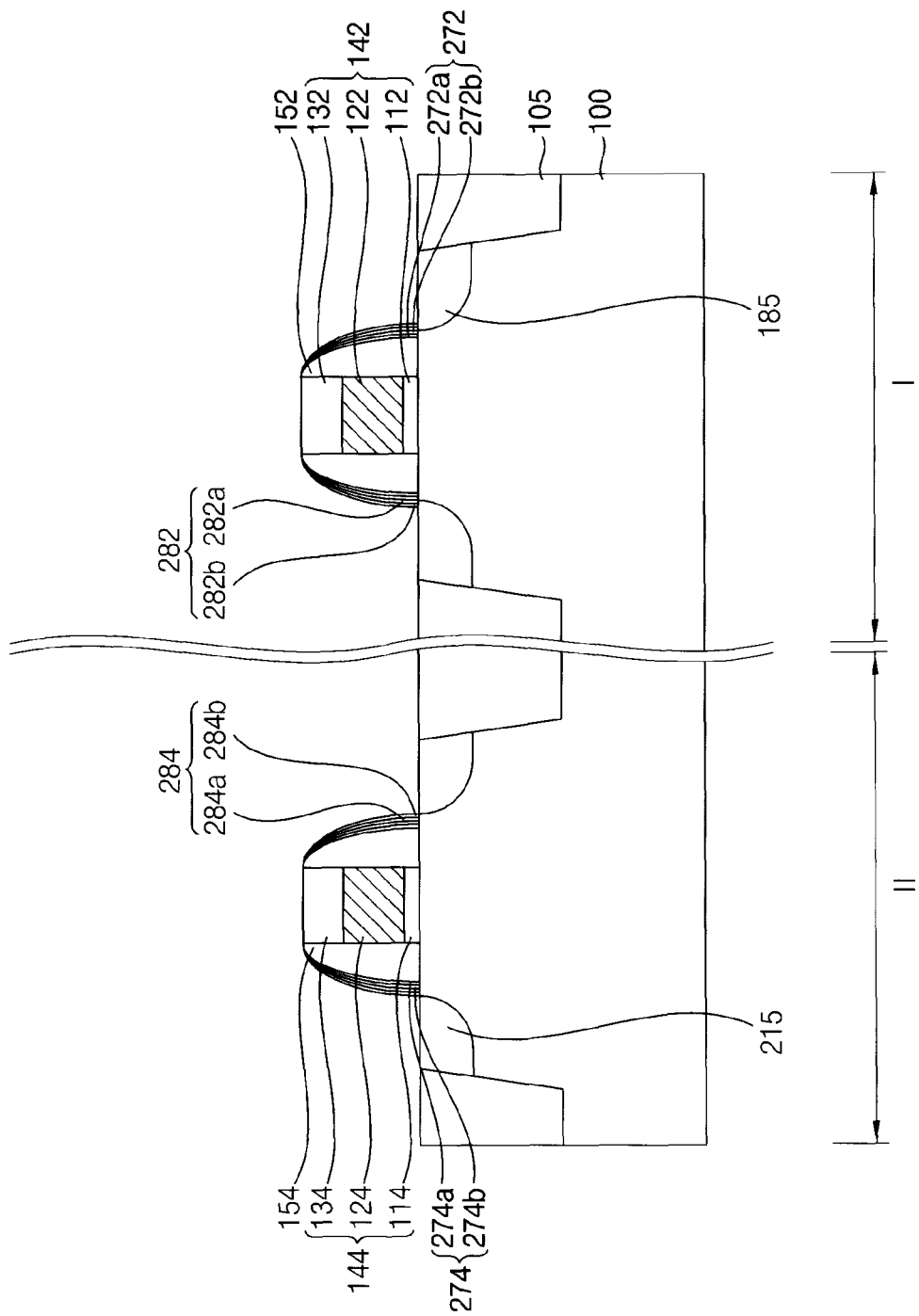

Referring to FIG. 25, processes substantially the same as or similar to those illustrated with reference to FIGS. 15 to 17 may be performed. Thus, the third capping layer pattern 284 may be formed on the second capping layer pattern 274, and the second epitaxial layer 215 may be formed on the substrate 100 adjacent to the second gate structure 144. The third capping layer pattern 284 may have fifth and sixth patterns 284a and 284b including silicon nitride and silicon oxide, respectively.

Additionally, a fourth capping layer pattern 282 may be formed on the first capping layer pattern 272, and may have seventh and eighth patterns 282a and 282b including silicon nitride and silicon oxide, respectively.

The method of forming the capping layer patterns including a multi-layered structure of a silicon nitride layer and a silicon oxide layer may be applied to the method illustrated with reference to FIGS. 18 to 21.

FIGS. 26 to 34 are cross-sectional views illustrating a method of manufacturing a semiconductor device in accordance with other example embodiments. The method in FIGS. 26 to 34 is directed toward manufacturing a dynamic random access memory (DRAM) device, and may include processes substantially the same as or similar to those illustrated with reference to FIGS. 1 to 7.

Figure 26:
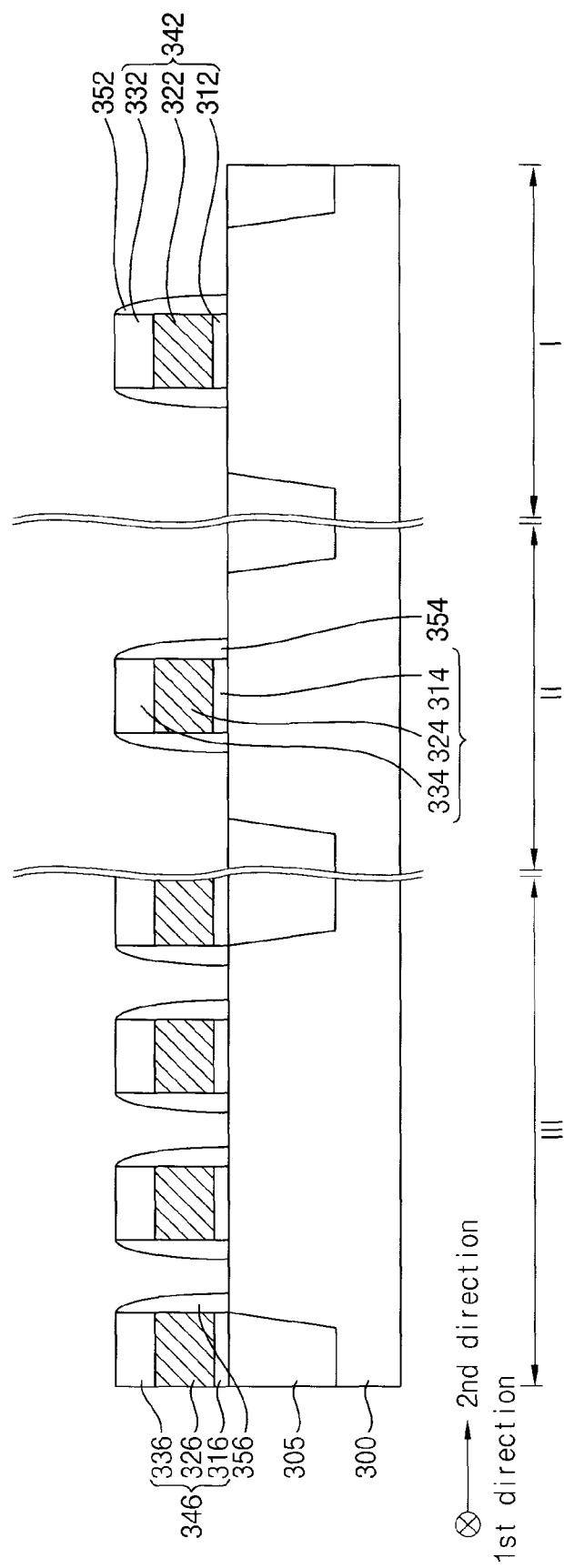
FIGS. 26 to 34 illustrate cross-sectional views of stages in a method of manufacturing a semiconductor device in accordance with other example embodiments.

Referring to FIG. 26, after forming an isolation layer 305 on a substrate 300, first, second, and third gate structures 342, 344, and 346 may be formed on the substrate 300 in first, second, and third regions I, II, and III, respectively. In example embodiments, a plurality of first gate structures 342, a plurality of second gate structures 344, and a plurality of third gate structures 346 may be formed in a second direction, and each first, second, and third gate structures 342, 344, and 346 may extend in a first direction perpendicular to the second direction. In example embodiments, the third region III may be a cell region, the first region I may be a PMOS region of a peripheral circuit region, and the second region II may be an NMOS region of the peripheral circuit region.

The first, second, and third gate structures 342, 344, and 346 may be formed by sequentially forming a gate insulation layer, a gate conductive layer, and a gate mask layer on the substrate 300, and patterning the gate mask layer, the gate conductive layer, and the gate insulation layer through a photolithography process. Thus, the first gate structure 342 may include a first gate insulation layer pattern 312, a first gate electrode 322, and a first gate mask 332 sequentially stacked on the substrate 300 in the first region I, the second gate structure 344 may include a second gate insulation layer pattern 314, a second gate electrode 324, and a second gate mask 334 sequentially stacked on the substrate 300 in the second region II, and the third gate structure 346 may include a third gate insulation layer pattern 316, a third gate electrode 326, and a third gate mask 336 sequentially stacked on the substrate 300 in the third region III.

First, second, and third spacers 352, 354, and 356 may be formed on sidewalls of the first, second, and, third gate structures 342, 344, and 346, respectively.

Figure 27:
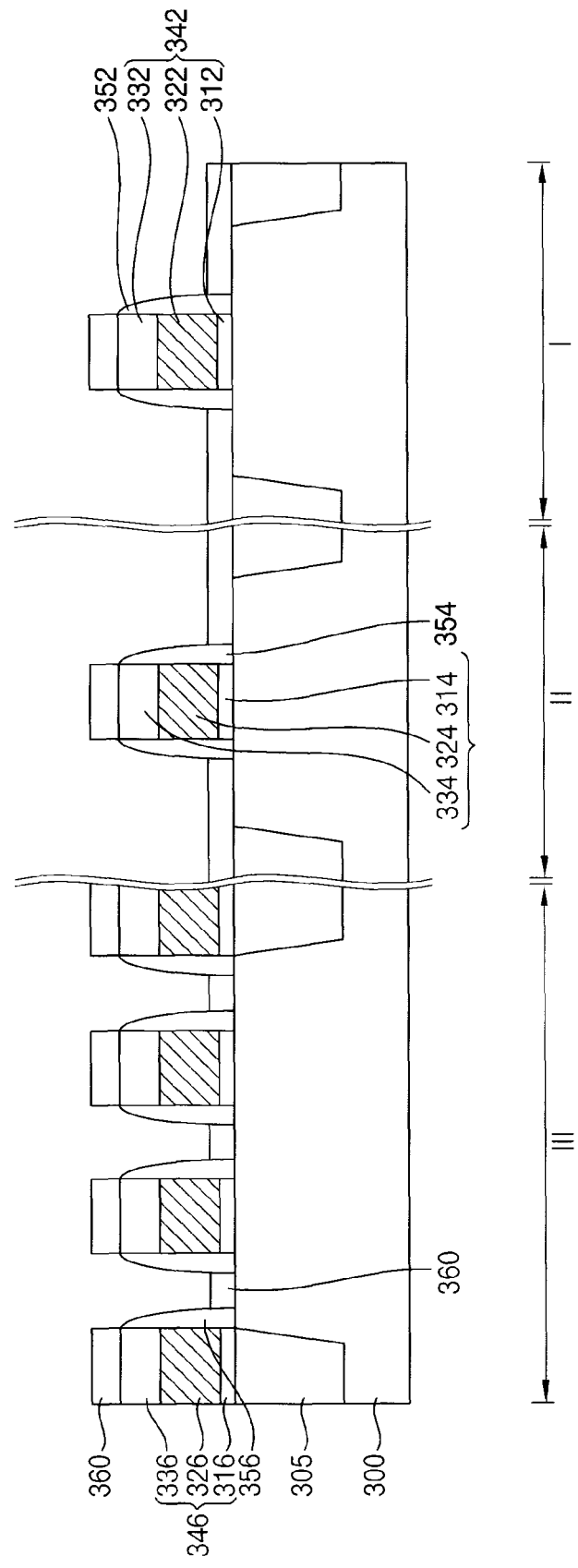

Referring to FIG. 27, a first high density plasma process having a substantially zero step coverage may be performed to form a first capping layer 360 on top surfaces of the first, second, and third gate structures 342, 344, and 346, and the substrate 300. Thus, the first capping layer 360 may not be substantially formed on the first, second, and third spacers 352, 354, and 356.

The first capping layer 360 may have a multi-layered structure of a silicon nitride layer and a silicon oxide layer sequentially stacked on the top surfaces of the first, second, and third gate structures 342, 344, and 346, and the substrate 300. Additionally, a second capping layer 390, subsequently formed, may have also a multi-layered structure of a silicon nitride layer and a silicon oxide layer sequentially stacked. Hereinafter, for the convenience of explanation, the capping layers 360 and 390 having a single layer are illustrated.

Figure 28:
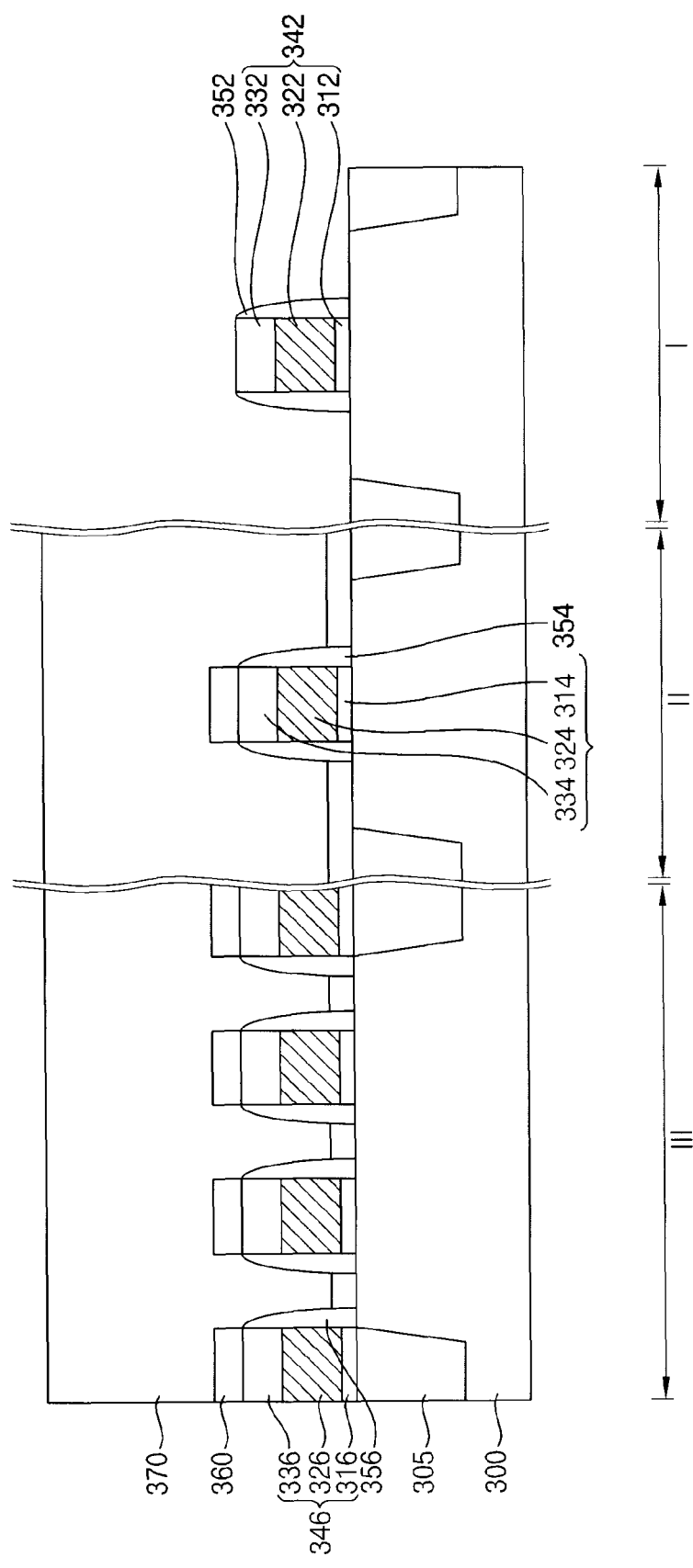

Referring to FIG. 28, after forming the first mask 370 covering the second and third regions II and III, a portion of the first capping layer 360 in the first region I may be removed using the first mask 370 as an etching mask. In example embodiments, the portion of the first capping layer 360 may be removed by an anisotropic etching process.

Figure 29:
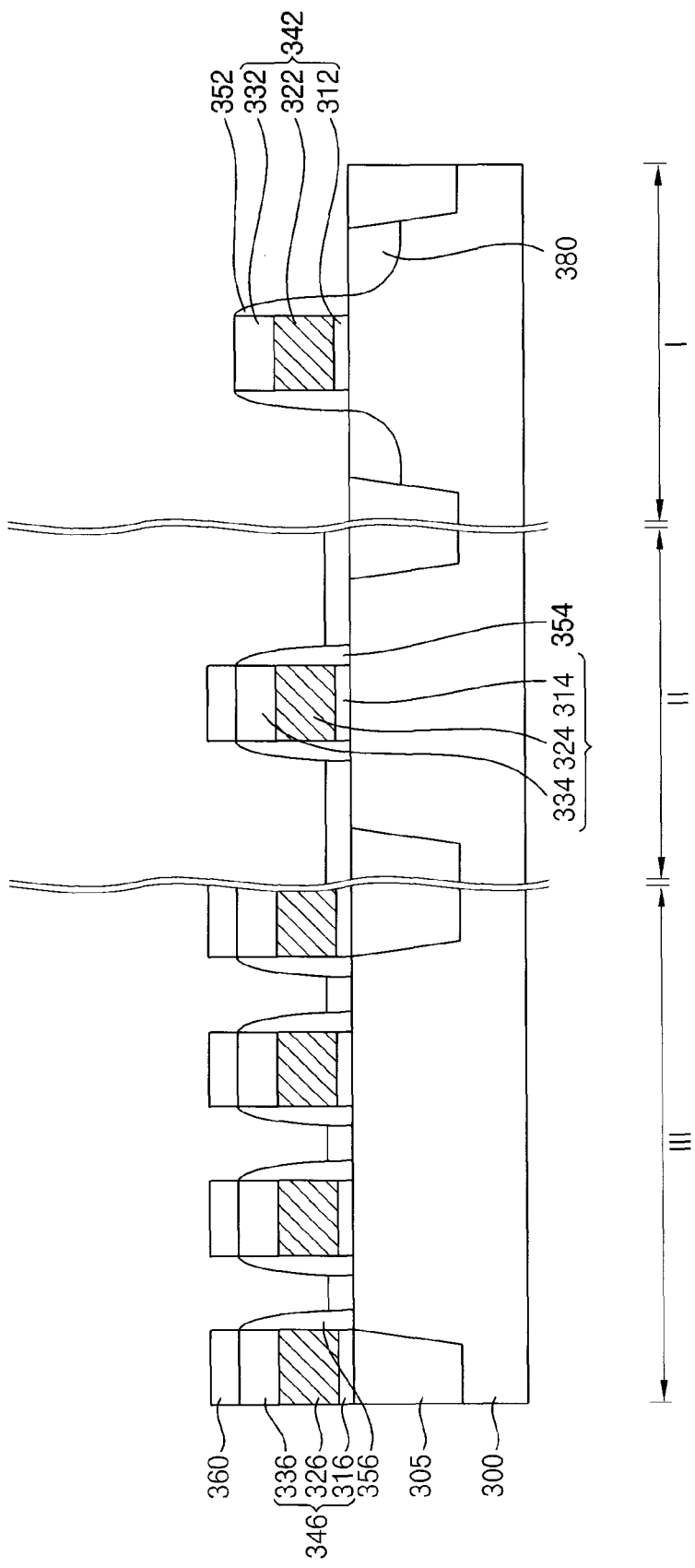

Referring to FIG. 29, an upper portion of the substrate 300 in the first region I may be removed to form a first trench (not shown) using the first mask 370, the first gate structure 342 and the first spacer 352 as an etching mask. Then, the first mask 370 may be removed, and a first epitaxial layer 380 may be formed to fill the first trench. In example embodiments, a single crystalline silicon-germanium layer doped with p-type impurities may be formed as the first epitaxial layer 380. The first epitaxial layer 380 may serve as a source/drain region of a PMOS transistor, and may be defined as a first source/drain region 380.

Figure 30:
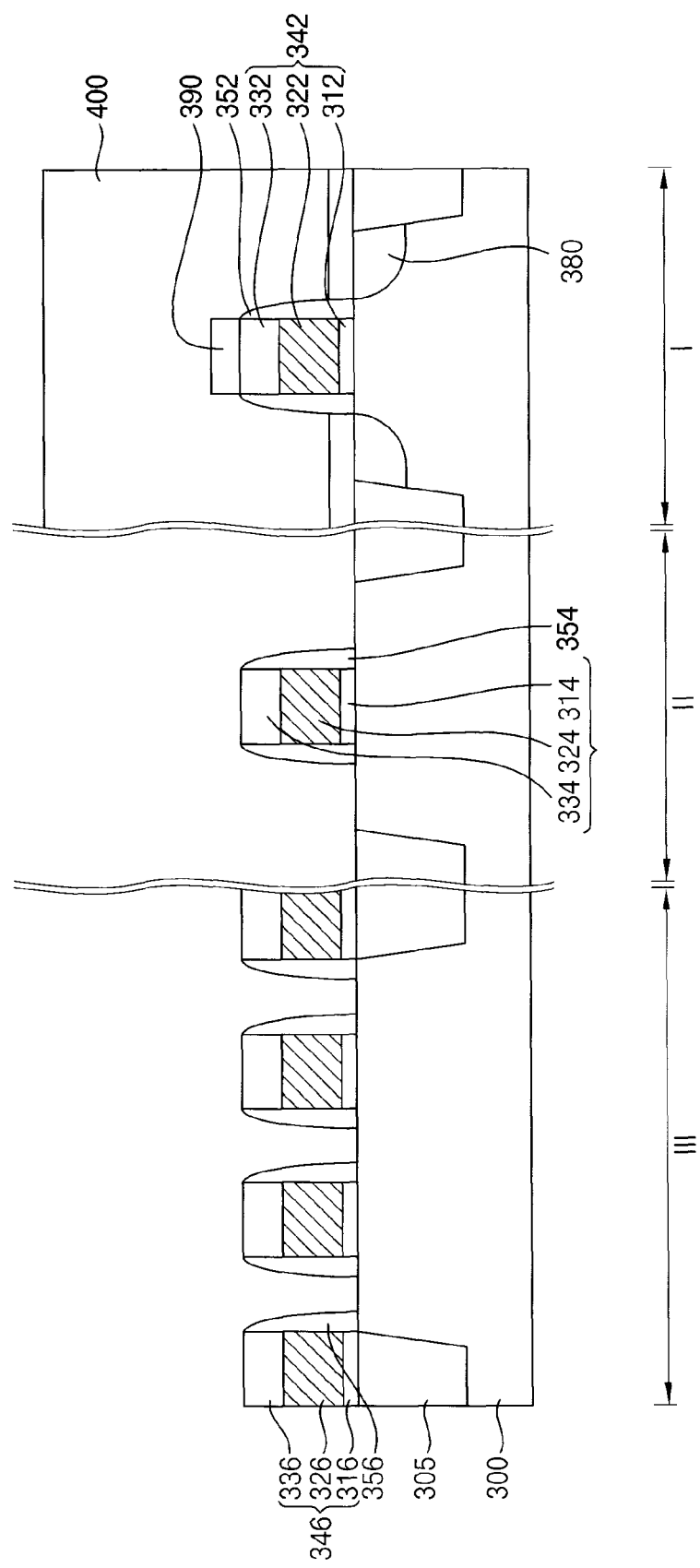

Referring to FIG. 30, a portion of the first capping layer 360 remaining in the second and third regions II and III may be removed.

Then, a second high density plasma process having a substantially zero step coverage may be performed to form a second capping layer 390 on top surfaces of the first, second and third gate structures 342, 344 and 346, and the substrate 300. Thus, the second capping layer 390 may not be substantially formed on the spacers 352, 354 and 356.

After forming the second mask 400 covering the first region I, a portion of the second capping layer 390 in the second and third regions II and III may be removed using the second mask 400 as an etching mask. In example embodiments, the portion of the second capping layer 390 may be removed by an anisotropic etching process.

Figure 31:
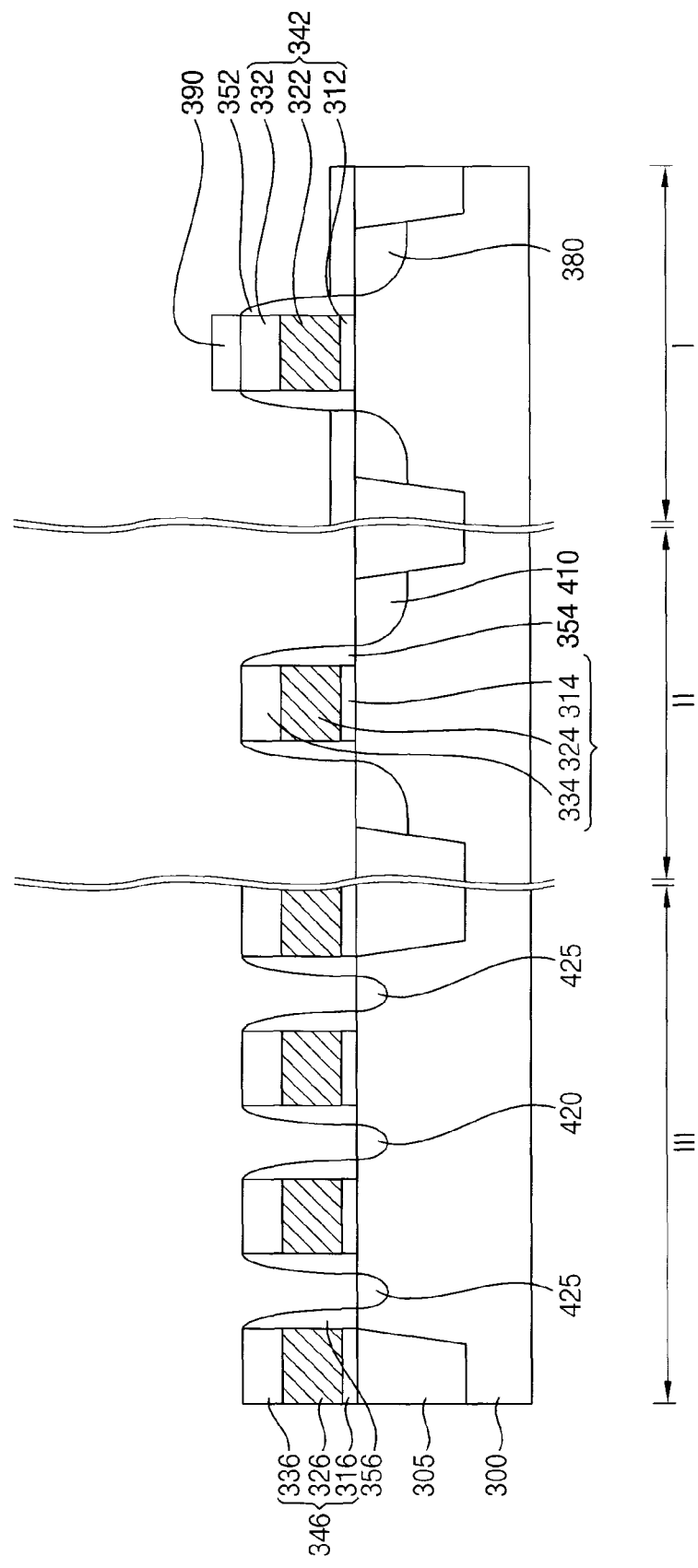

Referring to FIG. 31, upper portions of the substrate 300 in the second and third regions II and III may be removed to form second and third trenches (not shown), respectively, using the second mask 400, the second and third gate structures 344 and 346, and the second and third spacers 354 and 356 as an etching mask. Then, the second mask 400 may be removed, and a second epitaxial layer 410 may be formed to fill the second trench, and third and fourth epitaxial layers 420a and 420b may be formed to fill the third trench.

In example embodiments, a single crystalline silicon carbide (SiC) layer doped with impurities may be formed as the second, third and fourth epitaxial layers 410, 420a, and 420b. The second, third and fourth epitaxial layers 410, 420a, and 420b may serve as second source/drain regions of NMOS transistors, and may be defined as second, third and fourth source/drain regions, respectively.

Figure 32:
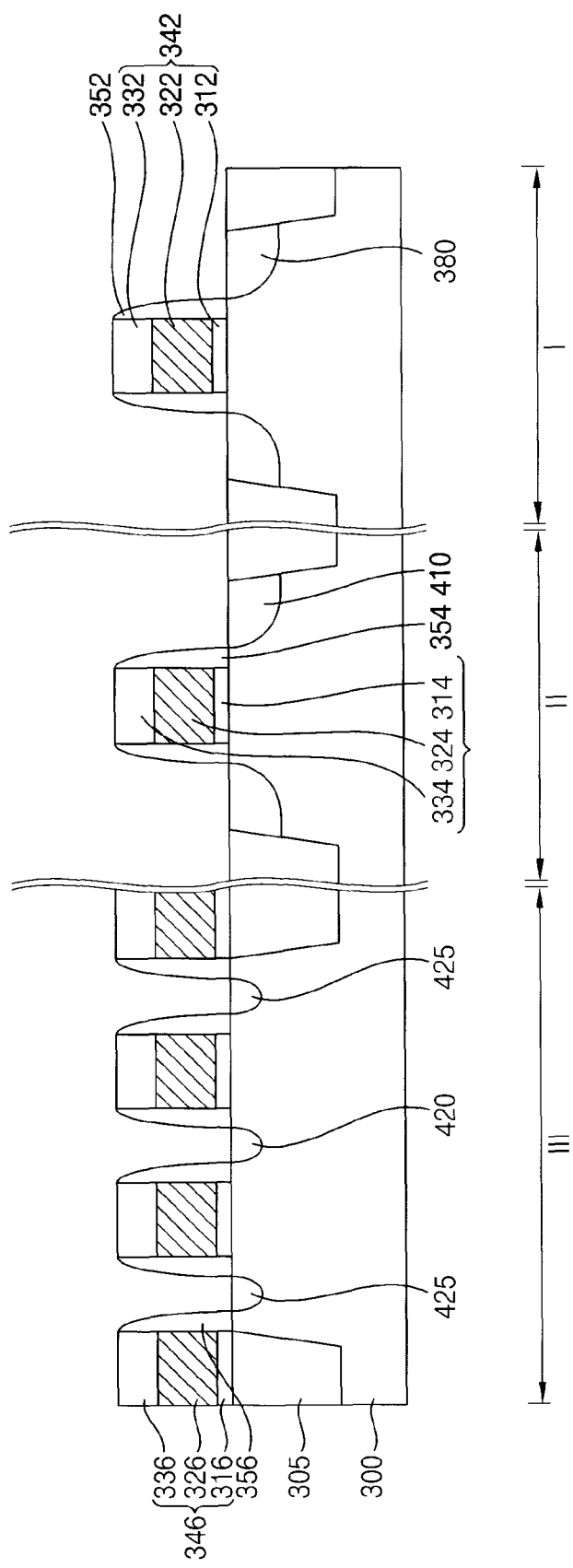

Referring to FIG. 32, a portion of the second capping layer 390 remaining in the first region I may be removed.

Figure 33:
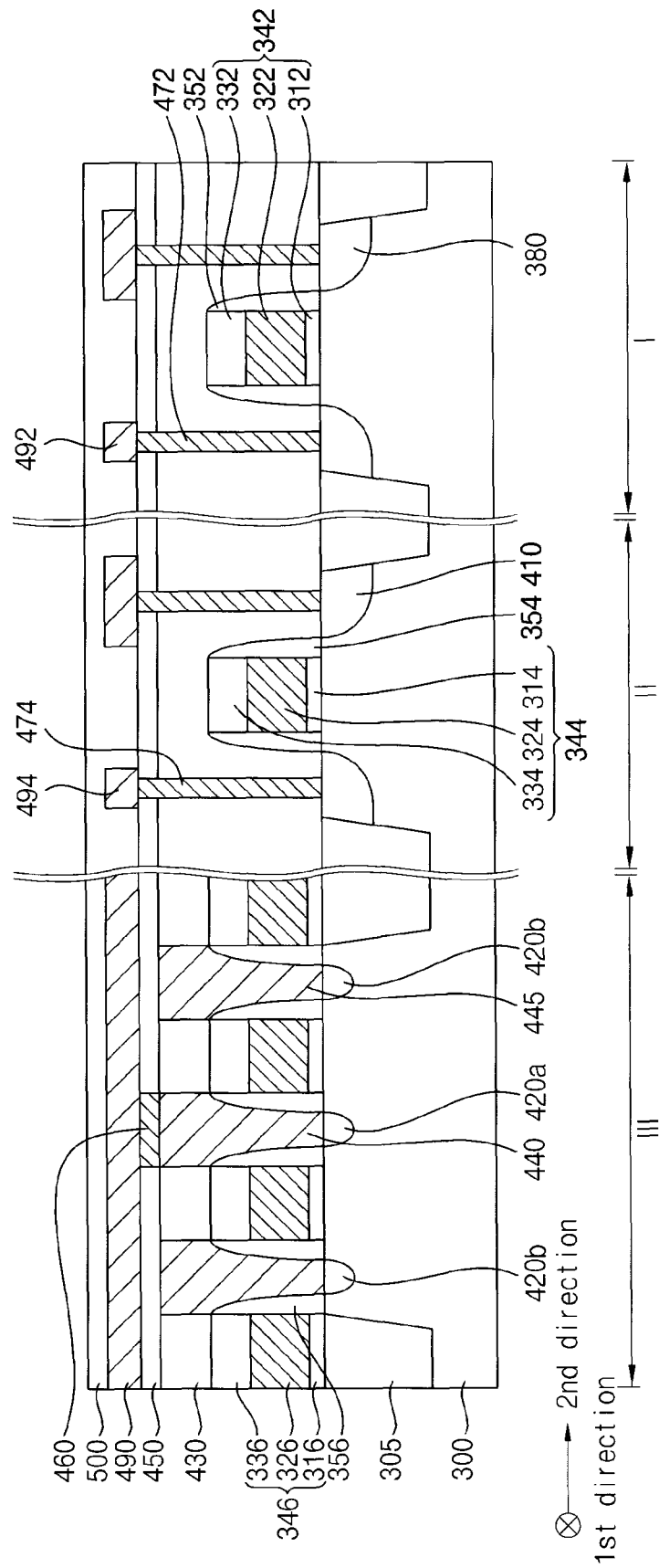

Referring to FIG. 33, a first insulating interlayer 430 may be formed on the substrate 300 to cover the gate structures 342, 344 and 346, and the spacers 352, 354, and 356. The first insulating interlayer 430 may be formed using an oxide, such as borophosphosilicate glass (BPSG), undoped silicate glass (USG), silicon on glass (SOG), and the like.

The first insulating interlayer 430 may be partially removed to form first openings (not shown) therethrough exposing the third and fourth source/drain regions 420a and 420b, and a first conductive layer may be formed on the substrate 300 and the first insulating interlayer 430 to sufficiently fill the first openings. The first conductive layer may be formed using doped polysilicon, a metal, a metal nitride and/or a metal silicide. An upper portion of the first conductive layer may be planarized until a top surface of the first insulating interlayer 430 is exposed to form first and second plugs 440 and 445 electrically connected to the third and fourth source/drain regions 420a and 420b, respectively.

A second insulating interlayer 450 may be formed on the first insulating interlayer 430 and the plugs 440 and 445. The second insulating interlayer 450 may be partially removed to form second openings (not shown) therethrough exposing the first plug 440 and the first and second source/drain regions 380 and 410. A second conductive layer may be formed on the substrate 300, the first plug 440 and the second insulating interlayer 450 to sufficiently fill the second openings. The second conductive layer may be formed using doped polysilicon, a metal, a metal nitride and/or a metal silicide. An upper portion of the second conductive layer may be planarized until a top surface of the second insulating interlayer 450 is exposed to form bit line contact 460 electrically connected to the first plug 440 and third and fourth plugs 472 and 474 electrically connected to the first and third source/drain regions 380 and 410, respectively.

A third conductive layer contacting the bit line contact 460 and the third and fourth plugs 472 and 474 may be formed on the second insulating interlayer 450 and patterned to form a bit line 490 electrically connected to the bit line contact 460 and first and second wirings 492 and 494 electrically connected to the third and fourth plugs 472 and 474, respectively. In example embodiments, the bit line 490 may be formed to extend in the second direction. The third conductive layer may be formed using doped polysilicon, a metal, a metal nitride and/or a metal silicide.

A third insulating interlayer 500 may be formed on the second insulating interlayer 450 to cover the bit line 490 and the first and second wirings 492 and 494.

Figure 34:
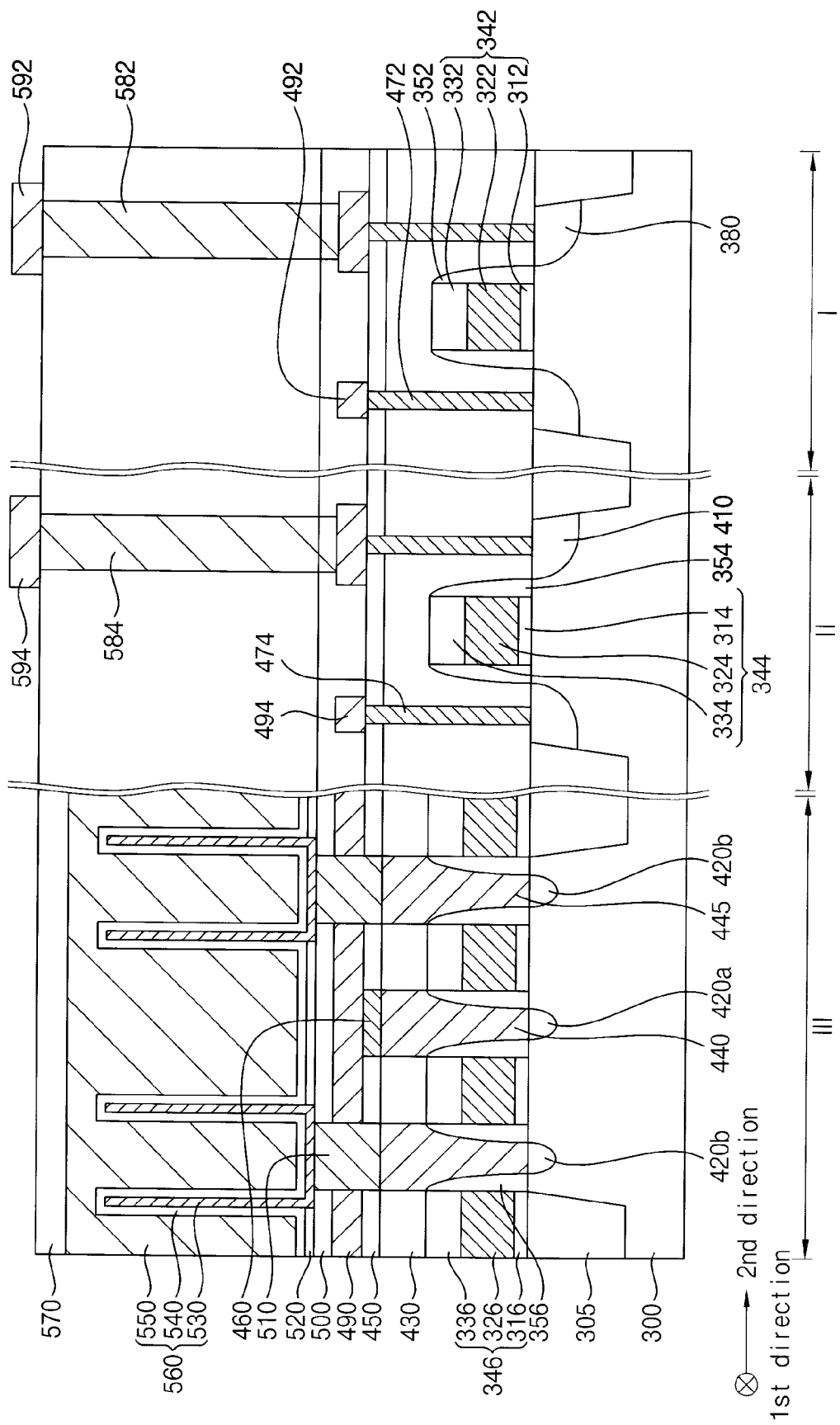

Referring to FIG. 34, the second and third insulating interlayers 450 and 500 may be partially removed to form third openings (not shown) exposing the second plugs 445. A fourth conductive layer may be formed on the second plugs 445 and the third insulating interlayer 500 to sufficiently fill the fourth openings. The fourth conductive layer may be formed using doped polysilicon, a metal, a metal nitride and/or a metal silicide. An upper portion of the fourth conductive layer may be planarized until a top surface of the third insulating interlayer 500 is exposed to form capacitor contacts 510 electrically connected to the second plugs 445.

An etch stop layer 520 and a mold layer (not shown) may be sequentially formed on the capacitor contacts 510 and the third insulating interlayer 500. In example embodiments, the etch stop layer 520 may be formed using silicon nitride, and the mold layer may be formed using silicon oxide. The mold layer and the etch stop layer 520 may be partially removed to form fourth openings (not shown) therethrough exposing the capacitor contacts 510. A fifth conductive layer may be formed on inner walls of the fourth openings and the mold layer, and a sacrificial layer (not shown) may be further formed on the fifth conductive layer to fill a remaining portion of the fourth openings. The fifth conductive layer may be formed using doped polysilicon, a metal, a metal nitride and/or a metal silicide. Upper portions of the sacrificial layer and the fifth conductive layer may be planarized until a top surface of the mold layer is exposed and the sacrificial layer may be removed to form a lower electrode 530.

A dielectric layer 540 may be formed on the lower electrode 530 and the etch stop layer 520. The dielectric layer 540 may be formed using silicon nitride or a high-k material such as tantalum oxide, hafnium oxide, aluminum oxide, zirconium oxide, and the like.

An upper electrode 550 may be formed on the dielectric layer 540. The upper electrode 550 may be formed using doped polysilicon, a metal, a metal nitride and/or a metal silicide.

The lower electrode 530, the dielectric layer 540 and the upper electrode 550 may form a capacitor 560.

A fourth insulating interlayer 570 may be formed on the third insulating interlayer 500 to cover the capacitor 560. The fourth insulating interlayer 570 may be partially removed to form fifth openings (not shown) therethrough exposing the first and second wirings 492 and 494. A sixth conductive layer may be formed on the first and second wirings 492 and 494 and the fourth insulating interlayer 570 to sufficiently fill the fifth openings. The sixth conductive layer may be formed using doped polysilicon, a metal, a metal nitride and/or a metal silicide. An upper portion of the sixth conductive layer may be planarized until a top surface of the fourth insulating interlayer 570 is exposed to form fifth and sixth plugs 582 and 584 electrically connected to the first and second wirings 492 and 494, respectively.

Third and fourth wirings 592 and 594 electrically connected to the fifth and sixth plugs 592 and 594 may be formed on the fourth insulating interlayer 570, and a protection layer (not shown) for protecting the third and fourth wirings 592 and 594 may be further formed on the fourth insulating interlayer 570 to form the semiconductor device.

Figure 35:
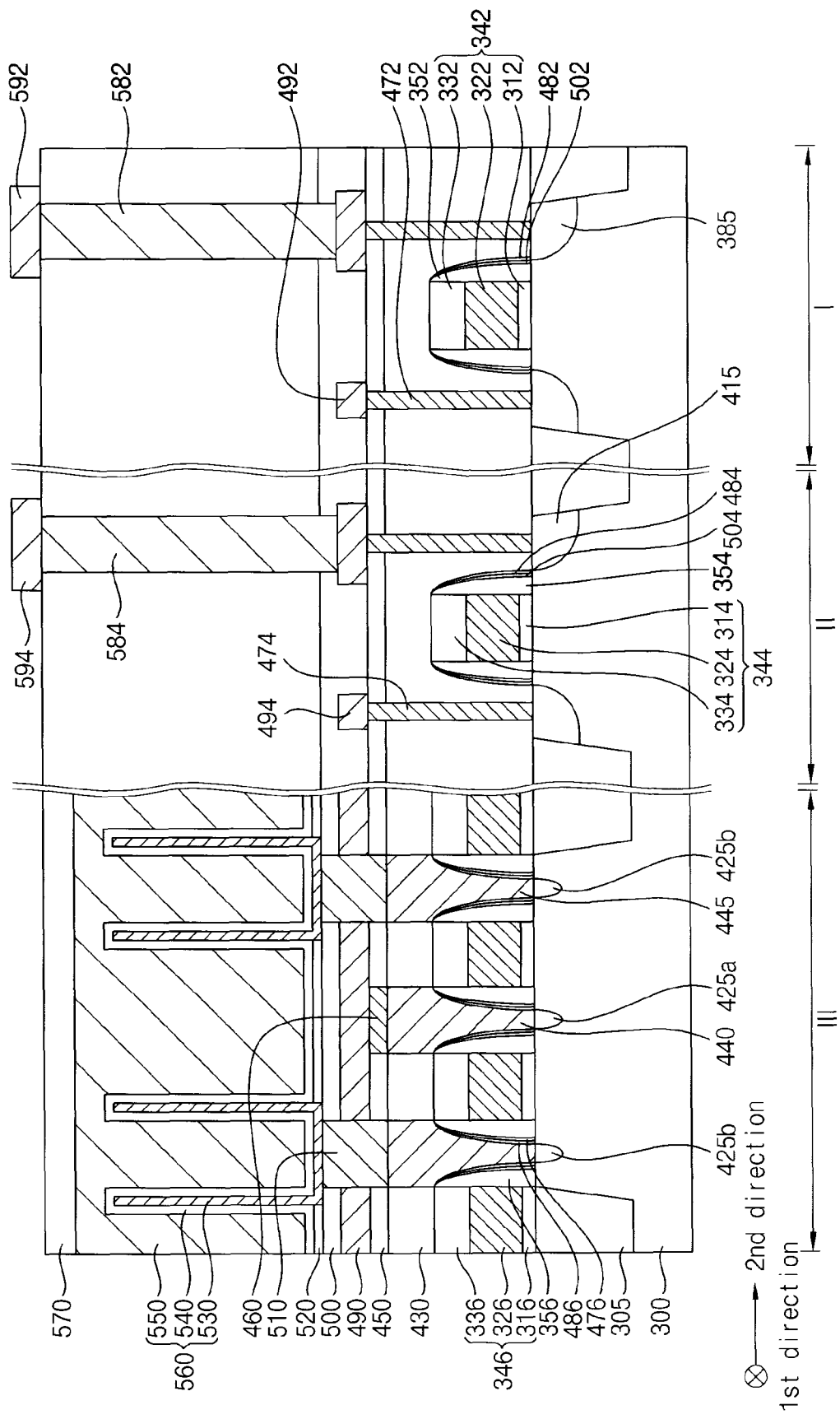
FIG. 35 illustrates a cross-sectional view of a method of manufacturing a semiconductor device in accordance with other example embodiments.

FIG. 35 is a cross-sectional view illustrating a method of manufacturing a semiconductor device in accordance with other example embodiments. The method may be substantially the same as or similar to that illustrated with reference to FIGS. 26 to 34, except that capping layers may be formed very thinly on sidewalls of gate structures or spacers like the method illustrated with reference to FIGS. 12 to 17. Thus, detail explanations on the processes are omitted here, and only capping layer patterns formed by the above processes are illustrated.

Referring to FIG. 35, first, second, and third spacers 352, 354, and 356 may be formed on sidewalls of first, second, and third gate structures 342, 344, and 346, respectively. Additionally, first, second, and third capping layer pattern structures may be formed on the first, second, and third spacers 352, 354, and 356, respectively.

Particularly, the first capping layer pattern structure may include a first capping layer pattern 502 and a sixth capping layer pattern 482 sequentially stacked on the first spacer 352, the second capping layer pattern structure may include a second capping layer pattern 504 and a fourth capping layer pattern 484 sequentially stacked on the second spacer 354, and the third capping layer pattern structure may include a third capping layer pattern 476 and a fifth capping layer pattern 486 sequentially stacked on the third spacer 356.

The first, second, and third capping layer pattern structures may include silicon oxide or silicon nitride. Each of the first to sixth capping layer patterns 502, 504, 476, 484, 486, and 482 may have a multi-layered structure of a silicon nitride layer and a silicon oxide layer sequentially stacked.

Figure 36:
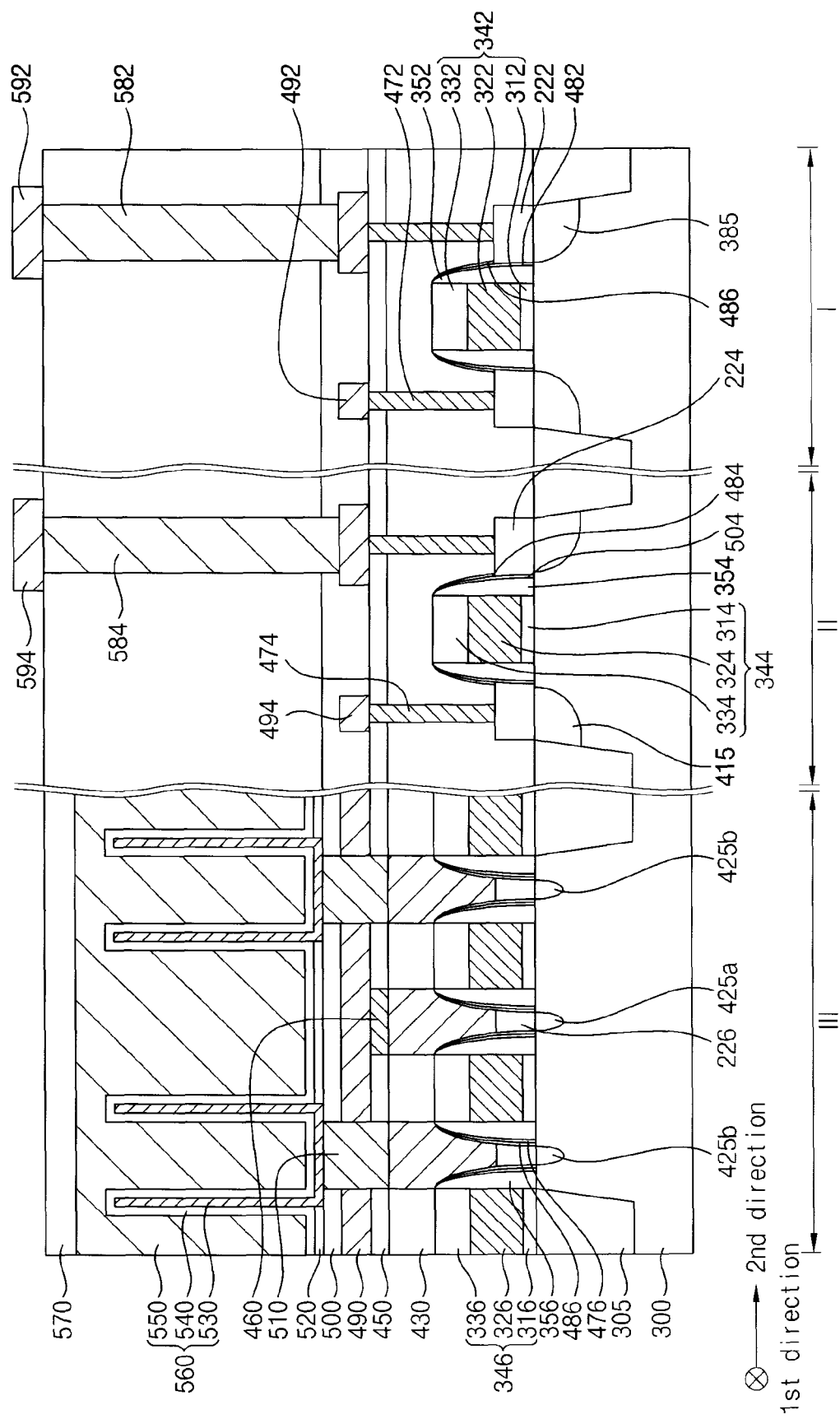
FIG. 36 illustrates a cross-sectional view of a method of manufacturing a semiconductor device in accordance with other example embodiments.

FIG. 36 is a cross-sectional view illustrating a method of manufacturing a semiconductor device in accordance with other example embodiments. The method may be substantially the same as or similar to that illustrated with reference to FIGS. 26 to 34, except that ESD layers may be further formed like the method illustrated with reference to FIGS. 18 to 21 and that capping layers may be formed very thinly on sidewalls of gate structures or spacers like the method illustrated with reference to FIG. 35. Thus, detail explanations on the processes are omitted here, and only ESD layers formed by the above processes are illustrated.

Referring to FIG. 36, first, second, and third spacers 352, 354, and 356 may be formed on sidewalls of the first, second, and third gate structures 342, 344, and 346, respectively. Additionally, first, second, and third capping layer pattern structures may be formed on the first, second, and third spacers 352, 354 and 356, respectively.

First and second ESD layers 222 and 224 may be formed on first and second epitaxial layers 385 and 415, respectively, and a third ESD layer 226 may be formed on third and fourth epitaxial layers 425*a* and 425*b*. The first epitaxial layer 385 and the first ESD layer 222 may be defined as a first source/drain region, the second epitaxial layer 415 and the second ESD layer 224 may be defined as a second source/drain region, the third epitaxial layer 425*a* and the third ESD layer 226 may be defined as a third source/drain region, and the fourth epitaxial layer 425*b* and the third ESD layer 226 may be defined as a fourth source/drain region.

The first and second plugs 440 and 445 may be formed on the third ESD layer 226, and the third and fourth plugs 472 and 474 may be formed on the first and second EDS layers 222 and 224, respectively.

According to example embodiments, a high density plasma process having a low step coverage may be performed to form a capping layer. Thus, the capping layer may be rarely formed on sidewalls of gate structures, so that the gap between the gate structures may not be increased and epitaxial layers adjacent to the gate structures may have a large volume.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming first and second gate structures on a substrate in first and second regions, respectively, the first and second gate structures having sidewalls;
    forming a first capping layer on the substrate and on the first and second gate structures by a first high density plasma process, such that the first capping layer covers the first and second gate structures except for the sidewalls thereof;
    removing a portion of the first capping layer in the first region;
    removing an upper portion of the substrate in the first region using the first gate structure as an etching mask to form a first trench; and
    forming a first epitaxial layer to fill the first trench.

2. The method as claimed in claim 1, wherein forming the first capping layer includes using silicon oxide.

3. The method as claimed in claim 2, wherein the first high density plasma process is performed using silane ($SiH_4$) gas and oxygen ($O_2$) gas at a flow rate of about 10 sccm to about 10,000 sccm, under pressure of about 1 mTorr to about 100 mTorr, and at a power of about 10 W to about 10,000 W.

4. The method as claimed in claim 1, wherein forming the first capping layer includes using silicon nitride.

5. The method as claimed in claim 4, wherein the first high density plasma process is performed using silane ($SiH_4$) gas, and one of nitrogen ($N_2$) gas and ammonia ($NH_3$) gas, at a flow rate of about 10 sccm to about 10,000 sccm, under pressure of about 1 mTorr to about 100 mTorr, and at a power of about 10 W to about 10,000 W.

6. The method as claimed in claim 1, wherein forming the first capping layer includes forming sequentially stacked a first layer and a second layer, the first and second layers including silicon nitride and silicon oxide, respectively.

7. The method as claimed in claim 1, wherein forming the first epitaxial layer includes performing a selective epitaxial growth (SEG) process using a silicon-germanium source gas.

8. The method as claimed in claim 7, wherein performing the SEG process further includes using a p-type impurity source gas.

9. The method as claimed in claim 1, further comprising forming a first elevated source drain (ESD) layer on the first epitaxial layer.

10. The method as claimed in claim 9, wherein forming the first ESD layer includes performing a SEG process using a silicon source gas and a p-type impurity source gas.

11. The method as claimed in claim 1, further comprising:
    removing a portion of the first capping layer remaining in the second region;
    forming a second capping layer on the substrate by a second high density plasma process, such that the second capping layer covers the first and second gate structures except for the sidewalls thereof;
    removing a portion of the second capping layer in the second region;
    removing an upper portion of the substrate using the second gate structure as an etching mask to form a second trench; and
    forming a second epitaxial layer to fill the second trench.

12. The method as claimed in claim 11, wherein forming the second epitaxial layer includes performing a SEG process using a silicon source gas and a carbon source gas.

13. The method as claimed in claim 12, wherein performing the SEG process further comprises using an n-type impurity source gas.

14. The method as claimed in claim 11, further comprising forming a second ESD layer on the second epitaxial layer by performing a SEG process using a silicon source gas and an n-type impurity source gas.

15. The method as claimed in claim 1, further comprising, after forming the first and second gate structures, forming first and second spacers on sidewalls of the first and second gate structures, respectively, such that the first capping layer is not formed on the first and second spacers.

16. The method as claimed in claim 1, further comprising:
    forming a third gate structure on a third region of the substrate;
    forming the first capping layer to cover the first, second, and third gate structures, except for sidewalls thereof;
    removing a portion of the first capping layer remaining in the second and third regions, after forming the first epitaxial layer;
    forming a second capping layer on the substrate by a second high density plasma process, such that the second capping layer covers first, second, and third gate structures except for sidewalls thereof;
    removing a portion of the second capping layer in the second and third regions;
    removing upper portions of the substrate in the second and third regions using the second and third gate structures as an etching mask to form second and third trenches, respectively; and
    forming second and third epitaxial layers to fill the second and third trenches, respectively.

17. The method as claimed in claim 16, wherein forming the first epitaxial layer includes performing a SEG process using a silicon-germanium source gas and a p-type impurity source gas.

18. The method as claimed in claim 16, wherein forming the second and third epitaxial layers includes performing a SEG process using a silicon source gas, a carbon source gas, and an n-type impurity source gas.

19. The method as claimed in claim 16, further comprising:
    forming a first ESD layer on the first epitaxial layer by a SEG process using a silicon source gas and a p-type impurity source gas; and
    forming second and third ESD layers on the second and third epitaxial layers, respectively, by a SEG process using a silicon source gas and an n-type source gas.

20. The method as claimed in claim 16, wherein the third region is a cell region, the first region is a PMOS region of a peripheral circuit region, and the second region is an NMOS region of the peripheral circuit region.

21. The method as claimed in claim 1, wherein forming the first capping layer includes forming discontinuous segments of the first capping layer on surfaces substantially parallel to a surface supporting the substrate.

22. The method as claimed in claim 21, wherein forming the first capping layer includes depositing material only on surfaces substantially parallel to a surface supporting the substrate.

* * * * *